(12) United States Patent
Bureau et al.

(10) Patent No.: US 8,298,946 B2
(45) Date of Patent: Oct. 30, 2012

(54) METHOD OF SELECTIVE COATING OF A COMPOSITE SURFACE PRODUCTION OF MICROELECTRONIC INTERCONNECTIONS USING SAID METHOD AND INTEGRATED CIRCUITS

(75) Inventors: Christophe Bureau, Juvisy-sur-Orge (FR); Sami Ameur, Sousse (TN)

(73) Assignee: Alchimer, Massy (FR)

( * ) Notice: Subject to any disclaimer, the term of this patent is extended or adjusted under 35 U.S.C. 154(b) by 1131 days.

(21) Appl. No.: 10/599,214

(22) PCT Filed: Mar. 22, 2005

(86) PCT No.: PCT/FR2005/000693
§ 371 (c)(1),
(2), (4) Date: Sep. 15, 2008

(87) PCT Pub. No.: WO2005/098087
PCT Pub. Date: Oct. 20, 2005

(65) Prior Publication Data
US 2009/0095507 A1    Apr. 16, 2009

(30) Foreign Application Priority Data
Mar. 24, 2004  (FR) ..................... 04 03022

(51) Int. Cl.
*H01L 21/44*  (2006.01)
(52) U.S. Cl. ........ 438/678; 438/666; 438/674; 438/677; 257/E21.586; 427/123

(58) Field of Classification Search .................. 438/678, 438/666, 674, 677; 257/773, E21.586; 427/123
See application file for complete search history.

(56) References Cited

U.S. PATENT DOCUMENTS

| | | | |
|---|---|---|---|
| 3,615,483 A | | 10/1971 | Jonker et al. |
| 4,661,384 A | * | 4/1987 | Sirinyan et al. ............... 427/304 |
| 5,147,518 A | | 9/1992 | Freilich |
| 6,589,329 B1 | * | 7/2003 | Baum et al. ............. 106/287.15 |
| 6,936,906 B2 | * | 8/2005 | Chung et al. ................... 257/486 |
| 7,074,690 B1 | * | 7/2006 | Gauri et al. ..................... 438/428 |
| 7,365,011 B2 | * | 4/2008 | Lavoie et al. .................. 438/687 |
| 7,405,157 B1 | * | 7/2008 | Reid et al. ..................... 438/677 |
| 7,449,099 B1 | * | 11/2008 | Mayer et al. ................... 205/122 |
| 7,494,927 B2 | * | 2/2009 | Kostamo et al. .............. 438/685 |
| 7,897,198 B1 | * | 3/2011 | Park et al. ..................... 427/97.1 |
| 2002/0004293 A1 | * | 1/2002 | Soininen et al. ............. 438/584 |
| 2003/0205823 A1 | * | 11/2003 | Leu et al. ...................... 257/774 |
| 2005/0266352 A1 | * | 12/2005 | Kano et al. .................... 430/311 |
| 2007/0298609 A1 | * | 12/2007 | Yakobson et al. ............. 438/653 |

FOREIGN PATENT DOCUMENTS

| | | |
|---|---|---|
| EP | 0 250 867 A | 1/1988 |
| EP | 0 430 333 A | 6/1991 |
| WO | WO 2004/075248 A | 9/2004 |

* cited by examiner

*Primary Examiner* — Nitin Parekh
(74) *Attorney, Agent, or Firm* — Alston & Bird LLP

(57) ABSTRACT

The present invention relates to a process for selectively coating certain areas of a composite surface with a conductive film, to a process for fabricating interconnects in microelectronics, and to processes and methods for fabricating integrated circuits, and more particularly to the formation of networks of metal interconnects, and also to processes and methods for fabricating microsystems and connectors.

25 Claims, 9 Drawing Sheets

METHOD OF SELECTIVE COATING OF A COMPOSITE SURFACE PRODUCTION OF MICROELECTRONIC INTERCONNECTIONS USING SAID METHOD AND INTEGRATED CIRCUITS

FIELD AND BACKGROUND OF THE INVENTION

The present invention relates to a process for selectively coating certain areas of a composite surface with a conductive film, to a process for fabricating interconnects in microelectronics, and to processes and methods for fabricating integrated circuits, and more particularly to the formation of networks of metal interconnects, and also to processes and methods for fabricating Microsystems and connectors.

In what follows, the prior art has intentionally been restricted to the field of microelectronics, as this is representative of the exacerbation of the technical difficulties in obtaining selective controlled coatings, as the demand, in terms of more rapid processing and ever finer etching, is becoming more pressing, especially for the production of self-aligned barriers on the copper tracks obtained after chemical-mechanical polishing (CMP) in damascene and dual damascene processes. A person skilled in the art may therefore readily transpose these problems to other applications such as Microsystems or connectors, as the problem is the same but simply on a different scale.

Integrated circuits are fabricated by forming discrete semiconductor devices on the surface of silicon wafers. A network of metallurgical interconnection is then established on these devices so to establish contacts between their active elements and to produce, between them, the wiring needed to obtain the desired circuit. A system of interconnects consists of several levels. Each level is formed by metal lines and these lines are connected together by contacts called "interconnect holes" or "vias".

The response time of an interconnect circuit is characterized by a constant RC, which corresponds roughly to the resistance R of the metal levels multiplied by their capacitive coupling represented by the constant C, mainly determined by the nature of the dielectric that separates the lines.

From the metallization standpoint, the response time of the interconnects is therefore reduced by reducing the resistance of the lines. It is for this reason that copper has been introduced into the more recent processes, replacing the more resistive and less electromigration-resistant aluminium. However, the introduction of copper raises several difficulties:

- it is necessary to use a damascene-type architecture in which the dielectric is deposited beforehand and then etched, before filling with copper and chemical-mechanical polishing. To meet the requirements of the microelectronics industry, very fine geometries (trench and via dimensions of less than 0.1 µm) having high AR or aspect ratio (AR about 4/1 for the trench and via dual damascene structure in its entirety) need to be able to be effectively filled;
- it is also necessary to prevent the diffusion of copper through the dielectric into the silicon, since copper is a poison for the active components. To do this, it is necessary to employ effective barriers, which in addition provide a solid interface, that is to say good adhesion between the copper and the dielectric.

In the damascene process, the metallization is carried out in three main steps:

step 1: deposition of a thin copper diffusion barrier layer, by PVD (Physical Vapour Deposition) or CVD (Chemical Vapour Deposition);

step 2: deposition of a thin copper tie layer, which also serves as a nucleation layer for the next deposition; and step 3: electroplating with copper, during which the substrate acts as a cathode on which the metal is deposited from a solution of its salt.

Once copper has been deposited, the excess copper is removed by CMP. The surface obtained is then in the form of a composite surface comprising alternating bands of copper and dielectric, each of the copper bands being bordered by a very fine semiconductor band, a vestige of the barrier layer installed in the trenches before filling with copper, and sliced off during the polishing. After these copper and dielectric bands have formed, they are then conventionally encapsulated with a uniform layer of the SiC or SiCN type, covering the entire composite surface, and serving as a copper diffusion barrier.

Now, these coatings are insulating, but they have a relatively high dielectric constant, which increases the capacitive coupling between copper lines. In addition, recent studies have shown that the interface between the copper lines and this insulating barrier is a weak point of the multilayer, from which catastrophic defects are initiated during the operation of the circuits (electromigration, crack initiation, etc.) (L. Peters, Semiconductor International, 2002, consultable on the Internet at the following address: http:/www.reed-electronics.com/semiconductor/article/CA224702?textcapping&stt=001&).

To improve the isolation of the copper lines and to increase the reliability of the interconnects for sub-65 nm technologies, one solution consists in using a barrier of the metal type, selectively deposited on the copper. This involves in fact depositing a copper diffusion barrier on the fourth side of the trenches, so as to completely enclose the copper lines in a "box", from which they can no longer emerge. Provided that this encapsulation barrier is highly adherent to the copper, the mobility of the copper at the copper/encapsulation barrier interface is greatly reduced and, consequently, the electrical current supported by the copper line, with no degradation, is higher and the resistance to electromigration increased. To do this, the encapsulation barrier must be self-aligned with the subjacent copper so as to avoid leakage currents between neighbouring copper lines. The approaches envisaged for this selective deposition are the selective chemical vapour deposition (CVD) of tungsten and the selective electroless plating with metal alloys. Metallic materials are therefore preferred because (i), in general, metals are considered to be more adherent to copper than dielectrics and (ii) the aforementioned selective techniques can be carried out for metals or alloys.

Electroless plating involves a reduction reaction in which a metal salt is reduced to metal, catalyzed on the surface of another metal. The metal salt solutions allowing metals to be deposited without the intervention of an external current or voltage source are called metallization solutions or electroless solutions.

The metal deposits that can exhibit barrier properties are those based on refractory metals such as tungsten, cobalt, nickel or their alloys and mixtures, optionally with certain additive elements such as phosphorus or boron. In particular, CoWP, CoWB and NiMoP deposits are currently employed, these all having in common the fact that they are obtained from electroless solutions containing especially cobalt salts, tungsten salts, nickel salts, molybdenum salts, etc., respectively, necessary for the barrier material, and also a reducing agent, for example dimethylaminoborane (DMAB). These reactions are in general catalyzed by transition metals (they are in particular autocatalytic). Such solutions are described for example in U.S. Pat. No. 5,695,810.

In theory, it is therefore possible to imagine that the copper of the metal lines could provide this catalytic action: the deposition would then take place exclusively on the surface of the copper lines. However, it is found in practice that copper is insufficiently catalytic to allow good growth of the deposit under these conditions.

To remedy this insufficiency, it is possible to activate the copper tracks, by attaching—selectively on these tracks—aggregates of other transition metals having superior catalytic properties. This is the case, for example, with palladium, platinum, cobalt, nickel or molybdenum, which are good catalysts for depositing metals in general.

Among these transition metals, palladium takes special place, given that the standard potential of its $Pd(II)/Pd^0$ pair is greater than that of the $Cu(II)/Cu^0$ pair. The result, in the presence of metallic copper, is that the Pd(II) ions are spontaneously reduced, to give a metallic palladium deposit on the copper (which itself will have been slightly oxidized on the surface). This property of palladium and copper standard potentials therefore results in spontaneous deposition—in principle selective deposition—of palladium on the copper tracks. It is this property that has resulted in the appearance of processes for constructing self-aligned barriers called "palladium activation" barriers, which comprise a step of forming palladium aggregates on the copper lines followed by a step of locally catalyzed growth of the metal barrier layer. In these processes, it is preferred to have palladium in the form of aggregates distributed over the copper lines, rather than in the form of a uniform layer, especially because:

(i) this makes it possible to increase the palladium/electroless solution contact area, and therefore locally increase the kinetics more effectively;

(ii) this makes it possible to minimize the amount of palladium present—in the end—at the interface between the copper and the metal barrier layer (it is in fact considered that palladium diffuses easily into copper, and may be the cause of degradation of its electrical conduction properties).

However, this technique is not entirely satisfactory either, insofar as several problems in the activation of the copper tracks by palladium are observed:

1) during the spontaneous reduction of the Pd(II) ions on the copper, the palladium deposit formed is conductive. This deposition can therefore continue by itself and give—not aggregates—but more bulky deposits, by the "mushroom effect". This means that the period of time in contact with a Pd(II) solution is a crucial parameter and that, if this time is too long, this necessarily results in a deposit on each line which is sufficient for it to join that of the neighbouring line and produce a short circuit. This is a source of instability in the process;

2) even before reaching these extremes, the palladium ions exhibit adsorption that is rarely completely specific and, what is more, is dependent on the nature of the dielectric present between the copper lines. This non-specific adsorption on the dielectric rather than on the copper does not entail per se the formation of metallic palladium on the dielectric (between the copper lines), but such becomes the case if this non-specific adsorption takes place in a region close to the copper line. In addition, the electroless solutions then used to produce the selective barrier deposits contain reducing agents which may convert the palladium ions adsorbed on the surface of the dielectric into palladium aggregates which will themselves catalyze, at the wrong point, the growth of the metal barrier and cause a short circuit. In all cases, lateral growth may take place, for the same reasons as in point 1) above, and result in a short circuit between the lines. It should be noted that this effect, even though already present on non-porous dielectrics of the $SiO_2$ or SiOC type, is even more pronounced when the dielectric is a porous material of low permittivity (K), in which there may be not only adsorption but also insertion:

3) in general, quite a strong dependence of the palladium activation is observed as a function of the CMP step that precedes the formation of the self-aligned barrier. Apart from the fact that this CMP step does not necessarily allow planarization, clearly revealing the copper lines relative to the dielectric lines, a number of CMP residues remain adsorbed on the copper tracks and cover them with a layer that prevents their reactivity from being expressed, and especially their redox reactivity. In certain cases, complete absence of activation by the palladium solutions, such that the copper lines are encumbered, may be observed; and 4) once the palladium aggregates have been deposited on the copper tracks, the surface thus activated is brought into contact with a suitable electroless solution. Now, it turns out that these palladium aggregates become detached from the surface of the copper tracks and go into the said solution, where they will fulfil their catalytic role with increased vigour (since reactions and catalyses are always more rapid within a volume than on a surface, for basic collision frequency factor reasons involved in the kinetic constants). Since the reactions of metal aggregate formation in a volume are in general autocatalytic, the immediate consequence of this desorption is the almost complete consumption of the electroless solution, this being in general very rapid or even instantaneous.

Thus, even though palladium does have a number of advantages owing to the value of its standard redox potential, this is insufficient to allow real selectivity of the deposition of the palladium aggregates, especially on very fine structures (structures of 0.2 μm and below, that is to say etching sizes compatible with integrated circuit technological generations of 130 nm and below).

Changing to aggregates of types other than palladium aggregates essentially entails the same types of drawbacks, to which is added the fact that it is not possible a priori to deposit them solely through their reduction by copper since the standard redox potential of their $M(x)/M^0$ pair (x=I or II and M=Co, Ni, Mo, W, etc.) is generally less than that of the $Cu(II)/Cu^0$ pair. One then relies on the presence of a reducing agent (for example of the DMAB type) directly in the bath containing these ions, and of various activators which enhance the catalytic effect of the copper. Thus, the reduction of these ions may in principle take place throughout the electroless bath, but it remains catalyzed particularly at points plumb with the copper lines. In fact, this results in there being only a copper track cleaning step by way of activation (in general by an acid treatment) followed by a step of contacting with an electroless solution containing sufficient additives to enhance the catalytic effect of copper. The drawback of these alternatives is the intrinsic instability of electroless solutions, and in particular of those that must also contain agents for enhancing the catalytic effect of copper.

The inventors were therefore given the objective of providing a process meeting all these requirements, satisfying the aforementioned specifications and furthermore solving the many aforementioned problems of the prior art, especially for the fabrication of metal interconnects, integrated circuits or other microsystems.

SUMMARY OF THE INVENTION

The surfaces involved in the present invention have the particular feature of being composite surfaces, that is to say consisting of a tiling of areas differing at least by the work function of the material of which they are made. The work function of a material is expressed in electron volts and corresponds to the energy to be delivered, in a vacuum, to a surface in order to extract an electron therefrom. More particularly, and as will be described hereinbelow, the present invention applies to composite surfaces, at least one subset of areas of which is electrically conductive.

The subject of the present invention is thus firstly a process for coating a composite material consisting of electrically conductive or semiconductive metal areas, particularly copper areas, and electrically non-conductive areas, the said process comprising at least one step of electroless growth of a metal layer plumb with the said electrically conductive or semiconductive metal areas, characterized in that the electrically non-conductive areas of the composite material are not formed from organic polymers and in that, prior to the said electroless growth step, the said process furthermore includes at least one first step of forming a nucleation layer by covalent or dative grafting of an organic or organometallic film on, and only on, the said electrically conductive or semiconductive metal areas, by bringing the said composite material into contact with organic or organometallic, difunctional precursors of the following formula (I):

$$A\text{-}(X)_n\text{---}B \quad (I)$$

in which:
A is a group having at least one reactive chemical function allowing the said organic precursor to be covalently and selectively attached to the surface of the said electrically conductive areas;
X is a spacer arm covalently linked to A and to B;
n is an integer equal to 0 or 1; and
B is a group having at least one ligand function for metal ions or for metal aggregates, that is to say allowing the complexation of metal ions and/or metal aggregates. This functional group may either be free (the difunctional precursor is then purely organic, and will be referred to as free or blank precursor), or may already complex an ion, and especially a metal ion, or a metal aggregate (the difunctional precursor is then an organometallic precursor, and this will be called a charged or mordanted precursor).

Preferably, the film thus formed has a thickness such that the free face of this film conforms to the local topology of the said composite surface on which it is placed. In general, the thickness of this film is between 1 and 100 nm, more preferentially between 1 and 10 nm and even more preferentially between 1 and 5 nm.

In the process according to the present invention, the layer serving for the selective growth of the metal layer therefore comprises an organic or organometallic film.

When the film is organometallic, it may be obtained either directly using precursors of the formula (I) which are themselves organometallic, that is to say in which B is a group having at least one ligand function that complexes metal ions, or via organic precursors, resulting in an organic film that is then treated with a solution of metal precursors that will be inserted onto or into the said film and allow "mordanting" of the grafted organic film. This organometallic film therefore comprises, intermixed, an organic part and a metallic material, with or without chemical interactions or bonding between them, depending on the nature of the chemicals used.

Thus, according to a first particular embodiment of the invention, the process furthermore includes a mordanting second step during which the organic or organometallic film formed on the electrically conductive or semiconductive metal areas is brought into contact with a mordanting solution comprising either at least one precursor of a metallic material or at least one precursor of a catalyst for its deposition, the said second step being carried out at the same time as or after the first step of forming the organic or organometallic film.

According to a second particular embodiment of the invention, the process furthermore includes, before the step of electroless growth of the metal layer is carried out, a third step that consists in reducing the said organometallic compound of formula (I) and/or the said precursor of the metallic material or the precursor of a catalyst for its deposition as a metallic material, or as a catalyst for its deposition, respectively. In this case, the metallic material forms conformally to the topology of the conductive or semiconductive areas of the said composite surface to be coated and on or within the said organic film in order to constitute, with the latter, a layer consisting either of a film or a field of aggregates, respectively, serving either for the nucleation or for the catalysis, respectively, of the growth of a metal layer from an electroless solution.

Hereafter the nucleation or catalysis layer will be called a "nucleation layer", without further details regarding its actual role in the construction of the upper metal layer. Table I below summarizes the various ways of carrying out the fabrication of the nucleation layer in accordance with the process according to the invention, depending on the nature of the grafted layer:

TABLE I

| Method of implementation No. | Step 1: Grafting of the layer | | Step 2: Mordanting | Step 3: Reduction of | Step 4: Electroless |
|---|---|---|---|---|---|
| | organic | organometallic | by metal precursors | the metal precursors | deposition of the metal layer |
| | Nucleation layer, activation step | | | | |
| I | ✓ | — | ✓ | — | ✓ |
| II | ✓ | — | ✓ | ✓ | ✓ |
| III | ✓ | — | — | — | ✓ |
| IV | — | ✓ | — | ✓ | ✓ |
| V | — | ✓ | — | — | ✓ |
| VI | — | ✓ | ✓ | — | ✓ |
| VII | — | ✓ | ✓ | ✓ | ✓ |

This shows three methods of implementation using organic difunctional precursors and four methods of implementation using organometallic difunctional precursors.

Table I above therefore illustrates that the nucleation layer may be formed in one or more steps. Whatever the number of steps needed for its fabrication, these steps will be called collectively by the name "grafting activation" steps when at least one of the steps includes a grafting reaction, that is to say a reaction involving the organic or organometallic precursors of formula (I) described above and resulting in the formation of an organometallic layer attached to the conductive or semiconductive areas of a composite surface by covalent or dative bonds.

The inventors have firstly found that the use of an organic film significantly improves the selectivity of the deposition of the nucleation layer and therefore of the upper metal layer, especially because the spontaneous surface chemistry and/or the chemical reactions initiated from the surface in order to obtain the organic film allows (allow) the geometrical topology of the composite surface to be maintained when they are accompanied by a chemical grafting reaction, that is to say when the adduct of the surface reaction with the precursors of these organic or organometallic films results in chemisorbed species on the conductive or semiconductive areas of the composite surface, that is to say species that form a dative or covalent bond therewith. In general, the inventors have observed that the selectivity obtained with this type of reaction is greater than that obtained in a direct manner using the known techniques of the prior art, that is to say by electroless deposition. Moreover, the non-polymeric nature of the electrically non-conductive areas of the composite material used according to the process of the invention allows the selective attachment of the organic film only plumb with the electrically conductive or semiconductive areas, insofar as the compounds of formula (I) as defined above cannot be attached thereto via covalent or dative bonds.

Secondly, the inventors have also observed the property of many organic materials constituting such films of being able to accommodate and/or support one or more precursors of metallic materials and to convert these precursors into the said metallic materials within these organic films or on their surface, especially when these films possess reactive functional groups capable of allowing the formation of dative or covalent bonds with precursors of metallic materials or with the metallic materials themselves.

Finally, the inventors have found that the process according to the invention, thanks to the presence of organic film plumb with the electrically conductive or semiconductive areas, makes it possible to considerably reduce the concentration of the metal ion, especially palladium ion, solutions used to carry out the mordanting step. The presence of this organic film makes it possible in particular to employ metal ion solutions having a concentration of less than $10^{-4}$M, that is to say solutions that are much less concentrated than the solutions normally used in the processes of the prior art.

The inventors then used these observations very astutely, by combining the use of these organic films and these precursors of metallic materials to form, on surfaces, nucleation films that conform to the topology of the starting composite surface, even down to a very small scale, thus solving the many problems of the prior art mentioned above.

According to one preferred method of implementing the invention, the reactive function of the group A of the difunctional, organic or organometallic, precursors of formula (I) above is chosen from functions carrying lone pairs, such as the following functions: amine, pyridine, thiol, ester, carboxylic acid, hydroxamic acid, thiourea, nitrile, salicylic, amino acid and triazine; the radicals obtained from cleavable functions, such as disulphide, diazonium ($—N_2^+$), sulphonium, iodonium, ammonium, alkyl iodide or aryl iodide functions; carbocations; carbanions (and especially those obtained via alkynes, organocuprates and organomagnesium, organozinc or organocadmium compounds).

As well as defined above, and when n=1, X is a spacer arm linked covalently to the groups A and B, and able to contribute to the stability of the molecule. X is preferably chosen from rings or from conjugated or unconjugated combinations of aromatic rings; saturated or unsaturated, branched or linear, aliphatic chains; and assemblies of these two types of functions, optionally substituted with electron-withdrawing or electron-donating groups in order to contribute to the stability of the entire molecule.

As examples of spacer arms X, mention may especially be made of linear or branched alkane chains ($—(CH_2)_m—$, with 1<m<25) such as, for example, methylene ($—CH_2—$) groups; the phenylene group ($—C_6H_4—$); phenylene groups substituted with electron-withdrawing groups, such as nitro, cyano or hydroxyl groups, etc., or electron-donating groups such as alkyl groups, preferably having from 1 to 4 carbon atoms such as, for example, the methyl group; groups carrying several fused aromatic rings, such as naphthylene or anthrylene groups, etc., which are themselves optionally substituted with one or more electron-donating or electron-withdrawing groups; and also structures consisting of combinations of these groups.

The spacer arms X of formula $—(CH_2)_m$, in which m is an integer not exceeding 10, are particularly preferred according to the invention.

Among the ligand functions defined above in respect of the part B of the difunctional, organic or organometallic, precursors of formula (I), mention may in particular be made of amines, amides, pyridines, nitrites, amino acids, triazines, bipyridines, terpyridines, quinolines, orthophenanthroline compounds, ethers, carbonyls, carboxyls and carboxylates, esters, hydroxamic acids, salicylic acids, phosphines, phosphine oxides, thiols, thioethers, disulphides, ureas, thioureas, crown ethers, aza-crown compounds, thio-crown compounds, cryptands, sepulcrates, podands, porphyrins, calixarenes, naphthols, isonaphthols, siderophores, antibiotics, ethylene glycol and cyclodextrins; substituted and/or functionalized molecular structures based on these functional groups; and their metal complexes with one or more metal ions or metal aggregates. In the latter case, when the ligand function of the group B is already "charged" with a metal precursor, the precursor of formula (I) will be said to be an organometallic precursor.

In certain cases, the function X may be "fused" into one and the same group with the groups A or B: this is the case for example when considering a pyridine carrying a group that can be grafted onto a metal, the latter group being, for example, in the para position of the nitrogen of the pyridine. In this case, the reactive function is this graftable group, and the pyridine ring takes the place both of X and of the ligand function, the X being the carbon part of the pyridine ring and the ligand function being the nitrogen of the pyridine ring, which is known to have complexing functions with respect to metals. Pyrimidines for example also fall within this category.

Among the compounds of formula (I) above, mention may most particularly be made of:

aryl diazonium salts functionalized in the para position of the diazonium group by a ligand function as defined above, optionally via a spacer arm X, such as the following compounds: $BF_4^-$, $^+N_2$-Φ-$(CH_2)_m$—$NH_3^-$, $BF_4$ in which, and with reference to formula (I) above, A= $BF_4^-$, $^+N_2$-Φ-; X=$—(CH_2)_m—$ in which m is an integer between 1 and 25 inclusive and B=$—NH_3^+$, $BF_4^-$; Φ being an aromatic ring, or the following compounds either in free thiol form ($BF_4^-$, $^+N_2$-Φ-$(CH_2)_m$—SH) or in disulphide form ($[BF_4^-$, $^+N_2$-Φ-$(CH_2)_m$—S—$]_2$), with A=$BF_4^-$, $^+N_2$-Φ-, X=$—(CH_2)_m—$ and B=$—$SH and in which m has the same meaning as previously;

alkyl or aryl iodides, functionalized by an aforementioned ligand function, such as the following compounds: iodoethanethiol, either in free thio form (I—$CH_2$—$CH_2$—SH) or in disulphide form ([I—$CH_2$—$CH_2$—S—$]_2$) with A=I—$CH_2$—, X=$—CH_2—$ and B=$—$SH;

bipyridines, such as bipyridine: Φ-Φ, where Φ is a pyridine ring, with A=Φ, B=Φ and X is reduced to the link between the two pyridine rings (n=0); or such as dipyridinylethane: Φ-CH₂—CH₂-Φ with A=Φ, X=—CH₂—CH₂— and B=Φ;

aminothiols, i.e. compounds carrying a thiol function and an amine function that are separated by an aliphatic and/or aromatic chain, such as cysteamine (H₂N—CH₂—CH₂—SH, with A=HS—, X=—CH₂—CH₂— and B=—NH₂), aminopropanethio (H₂N—CH₂—CH₂—CH₂—SH, with A=HS—, X=—CH₂—CH₂—CH₂— and B=—NH₂) or aminohexanethiol (H₂N—CH₂—CH₂—CH₂—CH₂—CH₂—CH₂—SH, with A=HS—, X=—CH₂—CH₂—CH₂—CH₂—CH₂—CH₂— and B=—NH₂), and sulphur-containing amino acids such as methionine;

diamines, such as ethylenediamine (H₂N—CH₂—CH₂—NH₂, with A=H₂N—, X=—CH₂—CH₂— and B=—NH₂) or hexamethylenediamine (H₂N—CH₂—CH₂—CH₂—CH₂—CH₂—CH₂—NH₂ with A=H₂N—, X=—CH₂—CH₂—CH₂—CH₂—CH₂—CH₂— and B=—NH₂); and polyethyleneimine (PEI).

Among the aryldiazonium salts, mention may most particularly be made of 4-ethylammonium phenyldiazonium tetrafluoroborate, 4-(2-aminoethyl)benzenediazonium ditetrafluoroborate, 4-cyanobenzenediazonium tetrafluoroborate, 4-carboxy-3-hydroxybenzenediazonium tetrafluoroborate, 3-carboxy-4-nitrobenzenediazonium tetrafluoroborate, 4-carboxybenzenediazonium and 4-thioethanolphenyldiazonium tetrafluoroborate.

The compounds of formulae (I-1) to (I-14) below are examples of grafting adducts obtained, for example, from aryldiazonium salts, the cleavage of which results in the formation of carbon/metal covalent bonds:

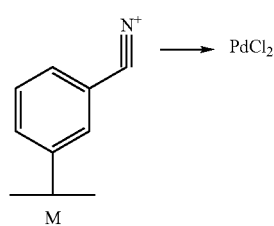
(I-1)

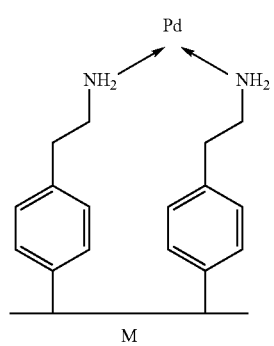
(I-2)

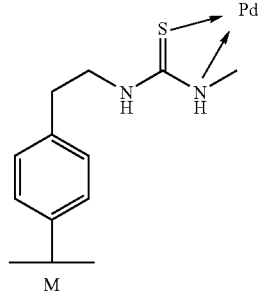
(I-3)

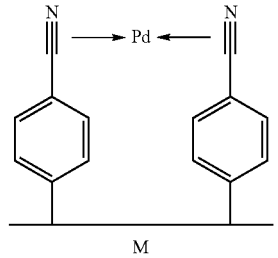
(I-4)

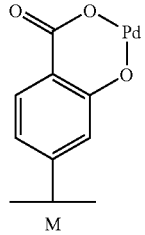
(I-5)

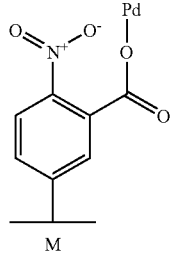
(I-6)

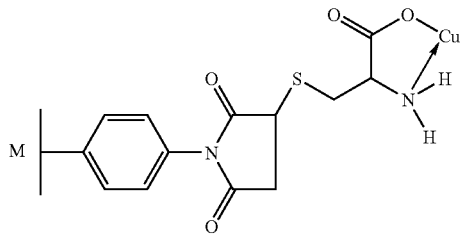
(I-7)

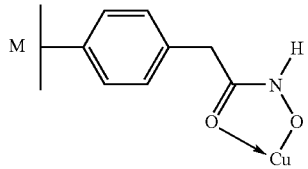
(I-8)

(I-9)

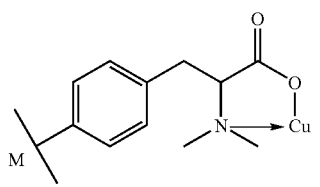

(I-10)

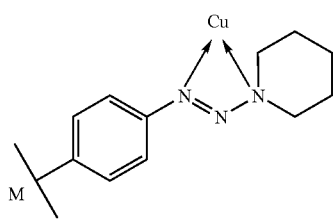

(I-11)

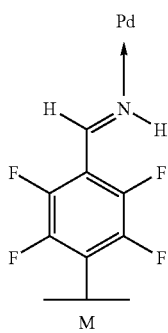

(I-12)

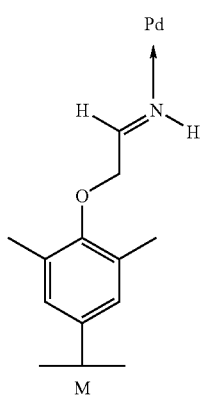

(I-13)

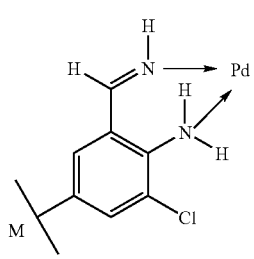

(I-14)

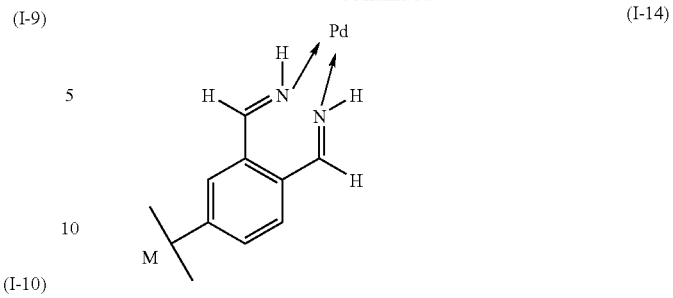

The structures (I-1) to (I-14) above have been shown once the grafting onto conductive area (M) of a composite material has been carried out and, optionally, once the metal mordanting has been carried out. The palladium or copper ions being shown merely by way of illustration: it is observed in fact that the ligand functions that are carried by the molecules thus grafted are rarely selective of a given ion, but in general have an affinity for many metal ions, and in particular for all transition metal ions.

This is one of the reasons why the present invention makes it possible to significantly improve the coating processes that include a palladium activation step, but also permits an immediate transposition to activations other than by palladium (as shown in Table I above, for methods of implementation I, II, VI and VII, the mordanting may be carried out after the grafting, but with metal precursors other than palladium precursors, and especially with cobalt or nickel precursors, or precursors of any other element present thereafter in the electroless solution), or even without palladium (the mordanting is not carried out, and the electroless solution is used directly on the grafted layer, as is the case in the method of implementation III of Table I above).

The molecules of formula (I) described above may be deposited in various ways on the conductive areas of composite surfaces, depending in particular on the nature of the functional group A: in most cases, it is observed that the aforementioned groups can react spontaneously and preferentially on the conductive or semiconductive areas of the composite surfaces, resulting in the formation of grafted organic layers, to the exclusion of the insulating areas, in which case simple contacting of the composite surface with a solution containing the molecules of formula (I) (for example by dipping, spin coating or spraying) may be suitable. There is then chemical grafting of the organic film onto the conductive or semiconductive areas of the composite surface.

Several methods of implementing the invention may be envisaged (see Table I above):

1) the activation of the conductive areas of the composite surface comprises two steps: a grafting activation step and a mordanting step using a metal salt (for example a palladium salt). In this case, the surface of the composite material is firstly treated with the solution containing the precursors of formula (I), according to one of the procedures described above. This step results in the formation of a film of difunctional precursors of formula (I), namely A-$(X)_n$—B as defined above, which is grafted onto the conductive areas of the composition material and offers the groups B including at least one ligand function in order to receive metal precursors. The surface is then brought into contact with a solution containing metal ions $M^{(n+)}$ that may be complexed by the ligand functions of the groups B of the compounds of formula (I) that are attached to the conductive areas of the composite material, by dipping, spin coating or spraying. This treatment allows the complexation, which converts the organic film into an organometallic film containing the metal ions of the mordanting bath. If the redox potential of the $M^{(n+)}/M^0$ pair is greater than that of one of the redox pairs of the conductive areas of the surface of the composite material (for example greater than that of the $Cu^{(2+)}/Cu^0$ pair in the case of copper tracks separated by insulating tracks for the formation of self-aligned barriers), the complexation is spontaneously followed by a reduction of $M^{(n+)}$ ions into metal $M^0$, resulting in the spontaneous formation of an organometallic film comprising grafted difunctional precursors of formula (I) and grafted metal atoms and/or metal aggregates, via the difunctional precursors of formula (I), on the conducting areas. This is for example the case if mordanting with palladium ions takes place on copper areas. Since the atoms or aggregates $M^0$ thus formed are in general catalysts for the reduction of other ions, they promote the continuation of the reduction of $M^{(n+)}$ ions, so that aggregates grafted onto the conductive areas are rapidly obtained, rather than single atoms, in a process similar to that occurring in the case of palladium directly on the copper in the absence of grafting. The contact time with the solution of $M^{(n+1)}$ ions is used to adjust the size of the aggregates obtained. However, it should be pointed out that the spontaneous reduction of $M^{(n+)}$ ions into $M^0$ atoms or aggregates can take place only if the $M^{(n+)}$ ions, once trapped by the ligand functions of the groups B grafted onto the surface, are not too far from the surface of the conductive area, as this reduction takes place following an oxidation of this area and by electron transfer between the conductive area and the $M^{(N+)}$ ions. Specifically, it will therefore be preferred to use grafting precursors whose spacer arm X is not too long, typically with a length of less than about 5 nanometres (thereby giving preference to compounds of formula (I) in which X represents $-(CH_2)_m-$ with m representing an integer not exceeding 10, so as to avoid the production of self-assembled layers in which the chains are straight and make the ligand function of the group B too far from the surface). Electron transfer between the conductive area and the complexed $M^{(n+)}$ ions may also be promoted using conductive spacer arms X (unsaturated groups) and/or by favouring low levels of grafting. This is because it is known that for a low level of grafting, it is somewhat improbable for the grafted organic fragments to be perpendicular to the surface, rather they are tilted or even almost flat on the surface, provided that the spacer arm has the sufficient degrees of rotational freedom to allow this. If such is the case, then the $M^{(n+)}$ ions may be closer to the surface than the strict length of the spacer arm. When the level of grafting of the organic precursors on the conductive areas is less than the maximum degree of coverage, only part of the conductive area is covered with a grafted organic film and part of the conductive area is still "bare" on which, for example, palladium aggregates may be spontaneously deposited as when grafting is absent. The problems observed in the prior art in this kind of situation may however be minimized, either by adjusting the level of grafting of the organic film, so as to minimize the surface area of ungrafted conductive areas, or, after grafting and mordanting, cleaning the surface sufficiently strongly to detach the ungrafted palladium aggregates but not the grafted aggregates. The inventors have in fact found that electroless deposition of metal aggregates on a copper surface results in metal/metal bonds only if the crystalline structures of the two metals are commensurate, that is to say if the geometrical parameters of the two types of material are the same. This is not in general the case, and it is very rare to be able to form meta/metal bonds between the aggregates spontaneously formed on the conductive areas, so that there is in fact no benefit from the enthalpies of metal/metal bonding. However, in the case of an organic film grafted using the process according to the invention, one grafting point is sufficient to form an attachment point for an entire aggregate, which will have been formed from an initially complexed $M^{(n+)}$ ion, so that there is a benefit each time from improved adhesion resulting from the grafting reaction. It may also be concluded from this observation that it is the level of grafting of the organic film that may act as the upper limit of the aggregate grafting density. This therefore offers an additional degree of freedom in order to limit the amount of palladium that will be present at the copper/barrier cap interface in the case of self-aligned barriers. Finally, the organic or organometallic precursors of formula (I) of the present invention are chosen in order to carry out grafting on the conductive or semiconductive areas of the composite surface, that is to say that the reactive chemical functions of the groups A have a high affinity for these areas. As illustrated in the examples illustrating the present application, it has been found that this affinity is such that the grafting may take place even when the conductive areas have not been cleaned beforehand. Thus, it is observed that the grafting results in bonds between the part A and the conductive area that are stronger than those that the conductive area—before treatment—supports with many impurities. The grafting activation treatment therefore makes it possible to obtain, on the conductive areas, grafting that shifts and "resets" the surface state of these areas whatever the treatments that they have undergone in the steps prior to the grafting activation. It is known that the grafting activation results in the presence of molecules on the conducting areas, but it is known what these molecules are, and it is also known that these molecules will promote the selective metallization of these areas. Finally, since the grafting also takes place on the semiconductive areas, the process of the present invention makes it possible to activate, in the same way, the narrow bands of semiconductor (TiN, TiNSi, TaN, TaN/Ta, WN, etc.) that are the vestiges of the barrier layer deposited before filling and CMP. This allows the adhesion of the self-aligned barrier/line interface to be controlled not only plumb with the copper band but also with respect to the edges. Returning to the image of the copper diffusion barrier "box", the present invention makes it possible to provide barrier "capping". Owing to their redox character, this property cannot be obtained by the processes of the prior art, the very principle of which is to function only plumb with the conductive surfaces. It should be noted that this property is common to all the methods of implementation that follow, which all have in common the use of graftable groups A;

2) the activation of the conductive areas of the composite surface comprises three steps, namely an activation step carried out by grafting, a mordanting step carried out by a metal salt (for example a cobalt salt) and a reduction step in which the salt thus trapped on the conducting areas is reduced. The extra step added over the method of implementation (1) is in general necessary when the redox potential of the $M^{(n+)}/M^0$ pair is less than that associated with the conductive areas of the composite surface. Reduction of the complexed $M^{(n+)}$ ions in the grafted film does not take place spontaneously, but must be caused by an external reducing agent. This may be carried out with any reducing agent, defined as a compound R associated with an $R^{(n+)/R0}$ pair whose redox potential is less than that of the $M^{(n+)}/M^0$ pair. Among such reducing agents, mention may especially be made of glucose, which allows the reduction of cupric ions (Fehling's solution), and dimethylaminoborane (DMAB), which allows the reduction of most transition metal ions. Use of this method of implementation has the advantage of allowing the formation of metal aggregates of a type other than palladium, and especially of aggregates of a metal already present in the electroless solution used thereafter (Co, Ni, etc.). In addition, since the complexing step carried out on the grafted film and the step of forming aggregates by reduction are not simultaneous, this method of implementation allows the size of the aggregates formed to be better controlled (the reducing solution used may, for example, contain no $M^{(n+)}$ ions for feeding the growth of the aggregates). However, this method of implementation has the drawback of requiring an extra step. Apart from this feature, the advantages listed for the method of implementation (1) remain valid;

3) the activation of the conductive areas of the composite surface comprises a single step, namely the activation step carried out by the grafting of an organic layer. The electroless solution is used directly on the composite surface thus treated, relying on the fact that this solution contains both metal ions and reducing agents, for example of the DMAB type.

According to this method of implementation, the complexation, the reduction and the electroless growth take place in a single step, thereby making it possible to restrict the number of steps substantially. Thanks to the activation by grafting, the abovementioned advantages, and especially the insensitivity of the steps prior to the activation, the high degree of selectivity offered by the grafting, and the additional degree of freedom offered by the grafting for the growth of the electroless plating layer, apply;

4) the activation of the conductive areas of the composite surface comprises two steps, namely an activation step carried out by grafting using an organometallic precursor, and a reduction step in which the metal sites carried by these precursors are reduced. This method of implementation makes it possible to profit directly from the selectivity of the grafting in order to attach the metal nuclei to the conductive areas, and therefore to avoid the losses of selectivity that may occur during the mordanting step for example. This method of implementation is particularly suitable for the case in which the complementary areas of the conductive areas consist of porous materials such as, for example, in the activation for electroless barriers when the dielectric separating the conductive lines is a low-permittivity dielectric of the porous type;

5) the activation of the conductive areas of the composite surface comprises a single step, namely an activation step carried out by the grafting of organometallic precursors constituting direct catalysts for the electroless growth of the metal layer. These may for example be precursors of formula (I) in which the ligand functions of the groups B are "charged" with $M^{(n+)}$ ions associated with a rapid $M^{(n+)}/M^0$ redox pair, the potential of which is greater than that which may intervene in the conductive areas (such as, for example, a palladium acetate facing a metallic copper surface), or they are charged directly with metal aggregates in the zero oxidation state;

6) the activation of the conductive areas of the composite surface comprises two steps, namely an activation step carried out by the grafting of an organometallic precursor and a mordanting step carried out by a metal salt (for example a palladium salt). This case involves the grafting of a precursor "charged" with ions that are not spontaneously reduced by the conductive areas, and the substitution of these ions takes place during the second step, which involves the mordanting, by ions that are themselves spontaneously reduced on the conductive areas (for example palladium ions on copper conductive areas). This method of implementation is particularly useful when it is desired to produce a composite metal deposit on a composite surface consisting of a tiling of conductive areas (S1) or semiconductive areas (S2) having work functions (W) that are quite similar ($W_{S1} < W_{S2}$). For this purpose it is possible to use organometallic grafting precursors charged with $M_1^{(n+)}$ metal ions and to carry out the grafting so as to obtain a uniform grafted film (this is possible on areas having work functions that are too close for there to be complete selectivity, especially if the composite surface has been generally heated or irradiated). The composite surface is then treated by a mordanting bath containing $M_2^{(n+)}$ ions, such that they are spontaneously reduced on $S_2$ but not on $S_1$, this being possible since $W_{S1}$, $< W_{S2}$. Metal $M_2$ is then deposited on $S_2$, but not on $S_1$. A further treatment by a mordanting bath containing $M_1^{(n+)}$ ions then allows the $M_2^{(n+)}$ ions to be resubstituted on the areas $S_1$. Finally, a treatment with a reducing bath allows metal $M_1$ to be deposited on $S_1$ and metal $M_2$ on $S_2$; and 7) the activation of the conductive areas of the composite surface comprise three steps, namely an activation step carried out by the grafting of organometallic precursors, a mordanting step carried by a metal salt, not spontaneously reduced on the conductive areas, and a reduction step in which the mordanted ions are reduced.

Thus, it may be seen that the present invention addresses the drawbacks of the processes known from the prior art, by improving the selectivity of the metal platings thanks to an activation step involving a chemical grafting reaction.

The difficulty of obtaining a self-aligned nucleation film by the techniques of the prior art has been mentioned and solved on the basis of the ability to produce an organic film that is selectively adherent to the conductive or semiconductive areas of the composite surface of the substrate, which film is capable of containing a precursor of the metallic material, and the lateral resolution of which is sufficiently good so as not to modify the geometry of the surface tiling, for example of the tracks.

The surfaces involved in the present invention are as many as the various possible applications of the present invention. These may be conductive or semiconductive surfaces of three-dimensional objects, or completely or partly semiconductive surfaces. The term "three-dimensional surface" is understood to mean a surface whose topological irregularities are dimensionally not insignificant relative to the thickness of the coating that it is desired to obtain. It may for example be the surfaces of substrates used for the fabrication of Microsystems or of integrated circuits, for example surfaces of silicon wafers and other materials known to those skilled in the art in the technical field in question. According to the invention, the substrate may for example be an inter-level layer for the fabrication of an integrated circuit, and especially the surface obtained by chemical-mechanical polishing (CMP) after a step of depositing a thick copper electroplating layer and of filling the trenches and/or vias in the production of copper interconnects in the damascene or dual damascene process. In the latter case, the composition material comprises surfaces that are almost planar and consisting of an alternation of copper tracks of width L separated by dielectric tracks. The narrowest widths are those of the first metal level (level $M_1$). The roadmap establishing fabrication processes in microelectronics sets the width L at about 120 nm in 90 nm technology, 85 nm in 65 nm technology, 50 nm in 45 nm technology and 40 nm in 32 nm technology. According to the invention, this width L is therefore preferentially between about 150 and 30 nm. It is therefore apparent that the present invention will be all the more relevant to the technological evolution during the decades to come, given the need to be able to obtain high selectivity of the electroless metal plating in order to cap increasingly narrow copper lines separated by increasingly narrow dielectric tracks.

The process of the present invention therefore solves the many problems mentioned above of the prior art that use processes which, on these scales, result in coatings extending above the dielectric tracks and producing an undesirable short circuit of the copper tracks. The process of the invention also offers the possibility of metal interconnect dimensions hitherto never achieved.

The precursors of the metallic material that serve for the nucleation layer and are used in the mordanting solution during the second step of the process according to the present invention are preferably chosen from metal ions, among which mention may be made of copper, zinc, gold, tin, titanium, vanadium, chromium, iron, cobalt, lithium, sodium, aluminium, magnesium, potassium, rubidium, caesium, strontium, yttrium, niobium, molybdenum, ruthenium, rhodium, palladium, silver, cadmium, indium, lutecium, hafnium, tantalum, tungsten, rhenium, osmium, iridium, platinum, mercury, thallium, lead and bismuth ions, ions of the lanthanides and of the actinides, and mixtures thereof. This is because it may also be beneficial, in certain cases, to use mixtures of metal ions. This is for example the case for the fabrication of interconnects for Microsystems, for example integrated circuits, in which the metal precursor may advantageously consist of copper, palladium or platinum ions.

In this case, the metal ion concentration within the mordanting solution used to produce this nucleation layer preferentially does not exceed $10^{-4}$M and even more preferably does not exceed $10^{-5}$M.

According to the invention, the organometallic precursor may contain not metal ions, but directly metal particles or aggregates. Such structures exist, and are stable when the metal particles or aggregates are encapsulated in a protective "gangue" chosen from the group consisting of polymer micelles or nanospheres, fullerenes, carbon nanotubes and cyclodextrins. In this case, the process according to the invention then preferably includes a step of releasing the particles or aggregates from their gangue, in addition to the grafting step.

During the second step, attachment of the metal precursor onto, or insertion into, the grafted organic film may be carried out by means of any technique which is suitable, taking into account the chemical nature of the film and of the precursor of the metallic material. The techniques that can be used within the context of the present invention for this step are therefore numerous—they go from simply bringing the precursor of the metallic material into contact with the organic film placed on the surface of the composite material, for example by dipping the organic film grafted onto the conductive areas of the composite into a suitable solution of the said precursor, for example of the type of those used in the prior art for electroless plating and such as described for example in U.S. Pat. No. 5,695,810, to more sophisticated techniques such as spin coating or spraying onto the surface of the said composite material.

One or other of the aforementioned methods of implementation thus allows the formation of an ultrathin film of precursor of the metallic material, which is adherent, selective and, in particular, conformal. This is because, unlike all the processes of the prior art, the process according to the invention makes it possible to forcibly localize the precursor of the metallic material on the conductive or semiconductive areas of the surface of the composite material, within the organic film conforming laterally to the topology of the said surface.

The mordanting solution used during the second step of the process according to the invention is a solution that allows the precursor of the metallic material to be conveyed right to the ligand functions of the groups B of the compounds of formula (I), thus allowing them to be complexed on and/or within the grafted organic film. This is therefore a solution that allows sufficient dissolution or dispersion of the metal precursor for carrying out the present invention. This is because, in the case of insoluble salts of the precursor of the metallic material, this solution must preferably be able to disperse the precursor of the metallic material sufficiently to be able to allow this precursor to be inserted into the organic film. The mordanting solution will therefore be chosen according to many criteria, among which the following may be mentioned: a surface criterion, for example in order to avoid chemical interactions such as the oxidation of the surface during implementation of the process; an organic film criterion, so that this solution does not remove film from the surface on which it has been deposited; a metallic material precursor criterion, which must allow it to be dissolved, but also allow it to be transformed into a metallic material; and a metallic material criterion, which must allow its formation within the organic film, and especially allow its deposition process to be carried out, for example its autocatalytic deposition.

Thus, the solvent of the mordanting solutions is preferably chosen from solvents that have a good solubilizing power for ions, and therefore a satisfactory dissociating power, such as water; alcohols, such as ethanol, methanol or isopropanol; dimethylformamide (DMF); dimethylsulphoxide (DMSO); or else acetonitrile.

The subject of the invention is also the composite material comprising at least one surface consisting of an alternation of electrically conductive or semiconductive areas and electrically non-conductive areas, which can be obtained by implementing the process according to the present invention and as described above, characterized in that the electrically non-conductive areas of the composite material are not formed from organic polymers and in that the electrically conductive or semiconductive areas are covered with a nucleation layer grafted covalently or datively and consisting of difunctional, organic or organometallic compounds of the following formula (I)

$$A\text{-}(X)_n\text{—}B \qquad (I)$$

in which:
A is a group having at least one reactive chemical function allowing the said organic precursor to be covalently and selectively attached to the surface of the said electrically conductive areas;

X is a spacer arm covalently linked to A and to B;
n is an integer equal to 0 or 1; and
B is a group having at least one ligand function for metal ions or for metal aggregates, that is to say allowing the complexation of metal ions and/or metal aggregates, The said film itself being coated with a layer of a metallic material.

Preferentially, A, X and B are as defined above.

The implementation of the process according to the invention is particularly advantageous in the field of microelectronics.

The subject of the present invention is also a process for fabricating interconnects in microelectronics, electronic Microsystems or integrated circuits, characterized in that the said process includes at least one step of grafting a film of difunctional precursors of formula (I) using the coating process as described above, the said interconnects being made of a metallic material. Thus, preferentially, the process for fabricating metal interconnects according to the present invention is characterized in that it comprises, in the following order, the steps consisting in:
 a) etching interconnect features in a dielectric substrate, the said features forming trenches and/or vias, on and/or through the said substrate,
 b) depositing a conductive barrier layer on the said etched dielectric substrate, which barrier layer prevents the migration of the interconnect metallic material into the said substrate, the said barrier layer having a thickness such that the free face of this layer conformally follows the interconnect features of the said substrate on which it is deposited;
 c) coating the conductive barrier layer deposited on the etched substrate with a nucleation film of a metallic material;
 d) filling the trenches and/or vias with the said metallic material starting from the said nucleation film, in order to form the said metal interconnects made of the said metallic material;
 e) uniformly and homogeneously abrading the surface, for example by chemical-mechanical polishing, for a time sufficient to cut off the protruding parts of the said etched features, in order to obtain a copper/dielectric composite surface;
 f) activating the said composite surface using the process according to the invention and as defined above, via the deposition of an organic or inorganic film grafted onto and self-positioned with respect to the conductive copper lines of the composite surface; and
 g) using the said film as a catalytic layer or nucleation layer for the electroless growth of a metal layer as a copper diffusion barrier, the said metal layer being self-positioned with respect to the copper conductive areas of the composite surface.

Finally, the subject of the present invention is the use of such a process for the fabrication of interconnect elements in microelectronics, of electronic Microsystems or of integrated circuits, and also the use of the interconnect elements in microelectronics, the electronic Microsystems and the integrated circuits that are obtained using such a process.

The coating process according to the invention may also be applied to the selective metallization of the source and drain of MOS transistors.

BRIEF DESCRIPTION OF THE DRAWINGS

Apart from the above arrangements, the invention also includes other arrangements that will become apparent from the following description, which refers to examples in which the copper lines of integrated circuits are activated after CMP by the grafting of a cysteamine film, a 4-ethyl(ammonium tetrafluoroborate)-diazonium tetrafluoroborate film or an ethylenediamine film, to an example of the grafting of various diazonium salts onto metals, to an example for the production of self-aligned barriers using a process comprising an activation step carried out by grafting according to the process of the invention, and to an example of the regioselective grafting of a palladium aggregate via a grafting step according to the process of the invention, and also to the appended FIGS. 1 to 18 in which.

EXAMPLES

However, it should of course be understood that these examples are given merely by way of illustration of the subject matter of the invention, these examples in no way constituting a limitation thereof.

Example 1

Activation of Copper Lines after CMP by the Grafting of an Aminoethanethiol(Cysteamine) Film This example is used to demonstrate the selective formation of catalytic palladium aggregates on 200 nm wide copper lines by the prior grafting of an organic layer using cysteamine as compound of formula (I).

The composite surfaces used were 5×1 cm² coupons obtained by cleaving etched integrated circuits (silicon wafers), after deposition of a TiN barrier, formation of a copper nucleation layer by physical vapour deposition, electrochemical filling with copper by electroplating and then chemical-mechanical polishing until the dielectric projections had been clipped off, so as to produce surfaces made from an alternation of copper tracks and dielectric ($SiO_2$) tracks.

The surface was cleaned using a cleaning solution ($S_{clean}$) after which the surface was treated with the grafting solution ($S_{graft}$) and then with the catalyst solution ($S_{cata}$) containing palladium ions as metal precursors.

The composition of the solutions used and the protocols for each of the steps are summarized in Tables II and III below:

TABLE II

| Solution | Composition of the solution | |
|---|---|---|
| $S_{clean}$ (cleaning) | Citric acid: | 5 g |
| | 18 Mohm water: | 100 ml |
| $S_{graft}$ (ligand) | 2-Aminoethanethiol/98% HCl: | 113.6 g |
| | Ethanol: | 100 ml |
| 20% $S_{cata}$ (catalysis) | $Na_2PdCl_4$: | 50 mg |
| | NaCl | 1.8 g |
| | 18 Mohm water | 250 ml |
| | HCl (37%) qs: | pH = 1 |

TABLE III

| Solution | Immersion | Comments |
|---|---|---|
| $S_{clean}$ (cleaning) | 2 min; gentle stirring | DI rinsing[a]/ CDA drying[b] |
| $S_{graft}$ (ligand) | 2 min; gentle stirring | Ethanol rinsing/ CDA drying |
| 20% $S_{cata}$ (catalysis) | 10 s; gentle stirring | DI rinsing/ CDA drying |

[a]DI rinsing means rinsing with deionized water;
[b]CDA denotes dry compressed air drying.

The surfaces thus treated were cleaved perpendicular to the direction of the trenches, and then examined via the edge by scanning electron microscopy (SEM).

Figure 1:
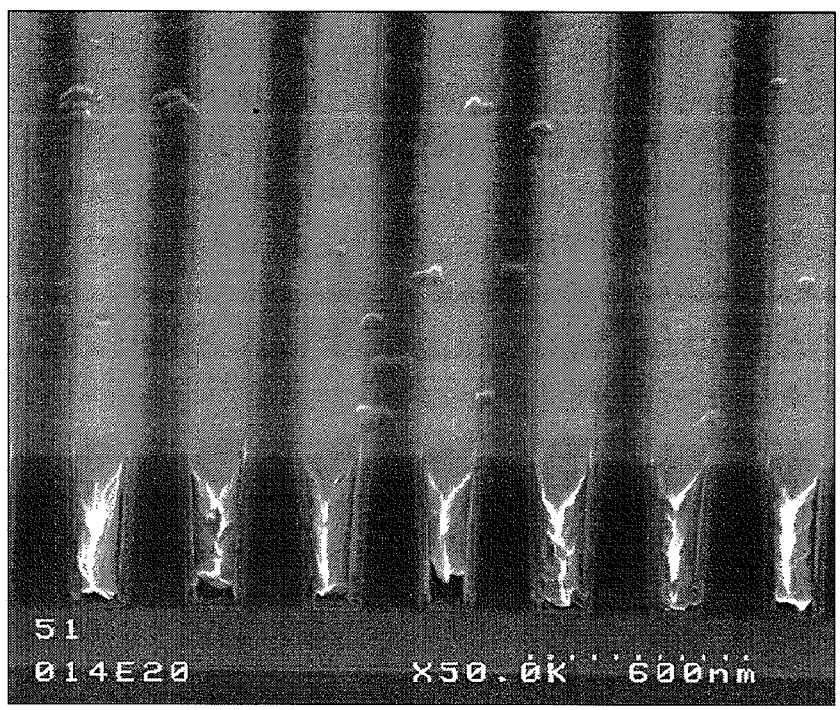
FIG. 1 shows a perspective view, obtained by scanning electron microscopy at a magnification of 50 000, of the surface of a 5×1 cm$^2$ coupon obtained by cleaving an etched silicon wafer and comprising an alternation of copper and dielectric lines after CMP but before cleaning.
Figure 2:
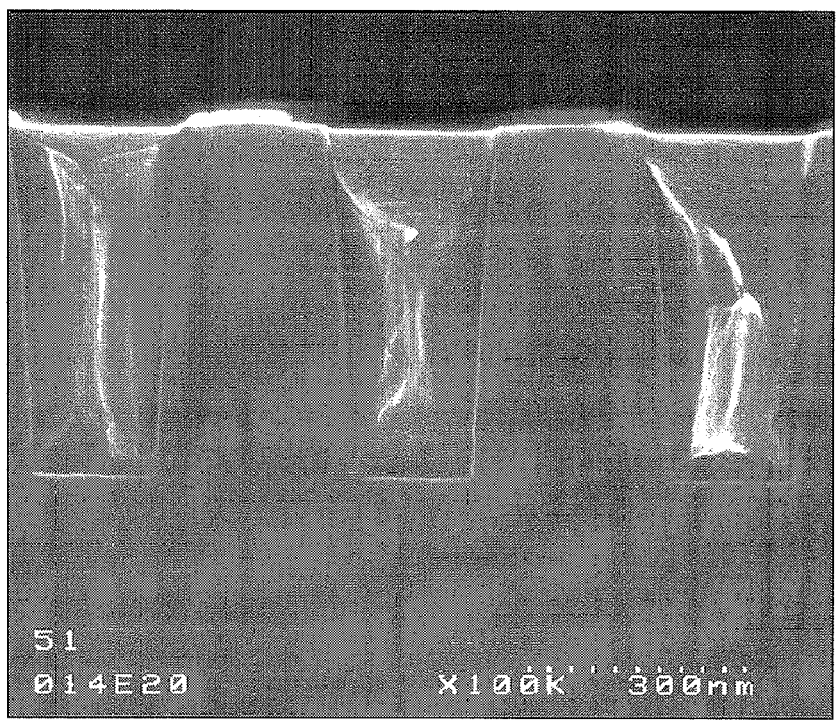
FIG. 2 shows a view via the edge of the coupon shown in FIG. 1, at a magnification of 100 000.
Figure 3:
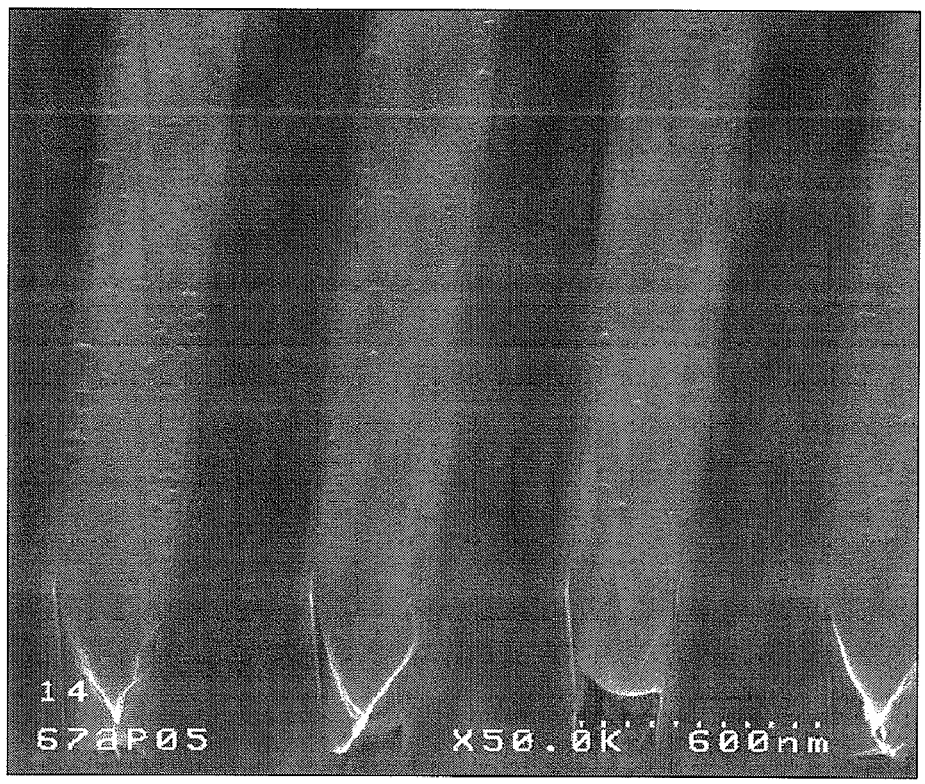
FIG. 3 shows a perspective view at a magnification of 50 000 of the coupon of FIG. 1, but after cleaning with a cleaning solution.
Figure 4:
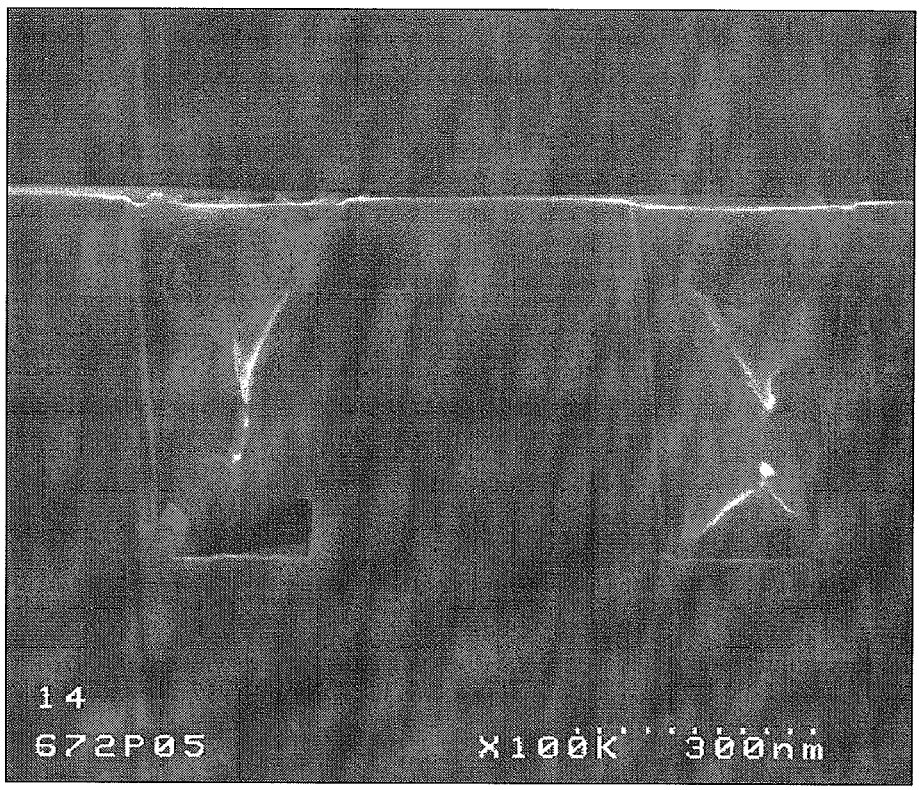
FIG. 4 shows an edge view at a magnification of 100 000 of the coupon of FIG. 2, but after cleaning with a cleaning solution.
Figure 5:
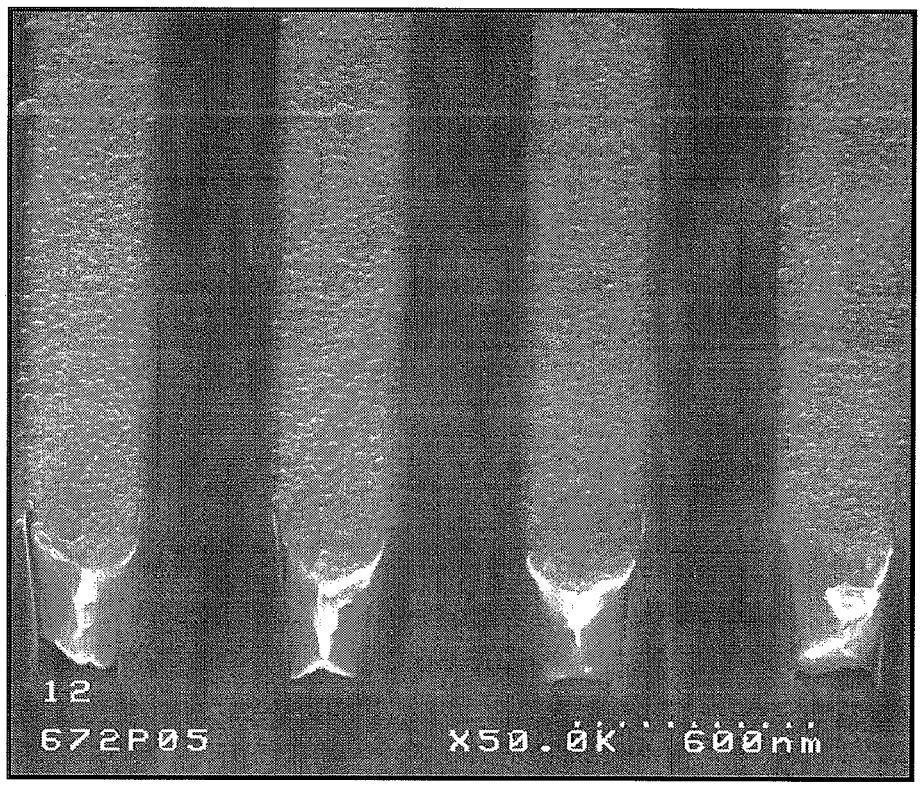
FIG. 5 shows a perspective view at a magnification of 50 000 of the coupon of FIG. 3, after activation of the surface by grafting of a cysteamine film and mordanting with a palladium solution.
Figure 6:
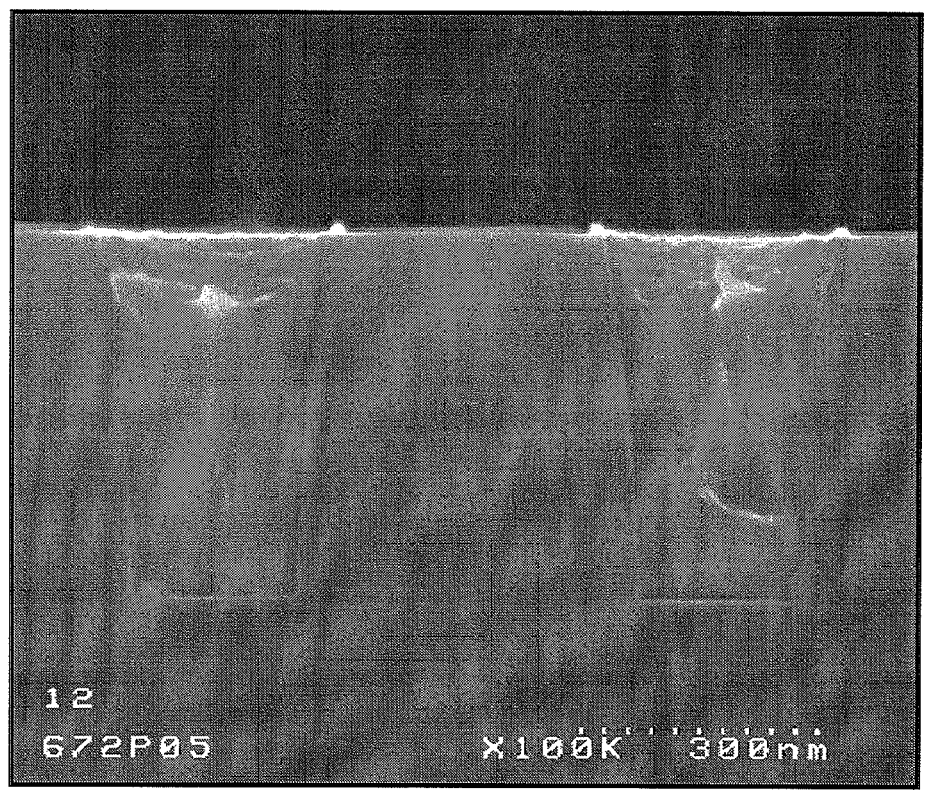
FIG. 6 shows an edge view at a magnification of 100 000 of the coupon of FIG. 4, after activation of the surface by grafting of a cysteamine film and mordanting with a palladium solution.

FIGS. 1 and 2 appended hereto show views, in perspective (×50 000 magnification) and via the edge (×100 000 magnification), respectively, of the surface before cleaning, i.e. after the CMP, revealing a number of impurities. FIGS. 3 and 4 show the same surfaces at the same magnifications after cleaning (solution $S_{clean}$) using the protocols indicated above. FIGS. 5 and 6 show (at the same magnifications) the result obtained after activation by grafting (with $S_{graft}$) then mordanting with the palladium solution ($S_{cata}$).

The spontaneous formation of palladium aggregates plumb with the copper tracks is observed, with a very high selectivity since there is no deposition of aggregates on the dielectric tracks situated between the copper lines.

Figure 7:
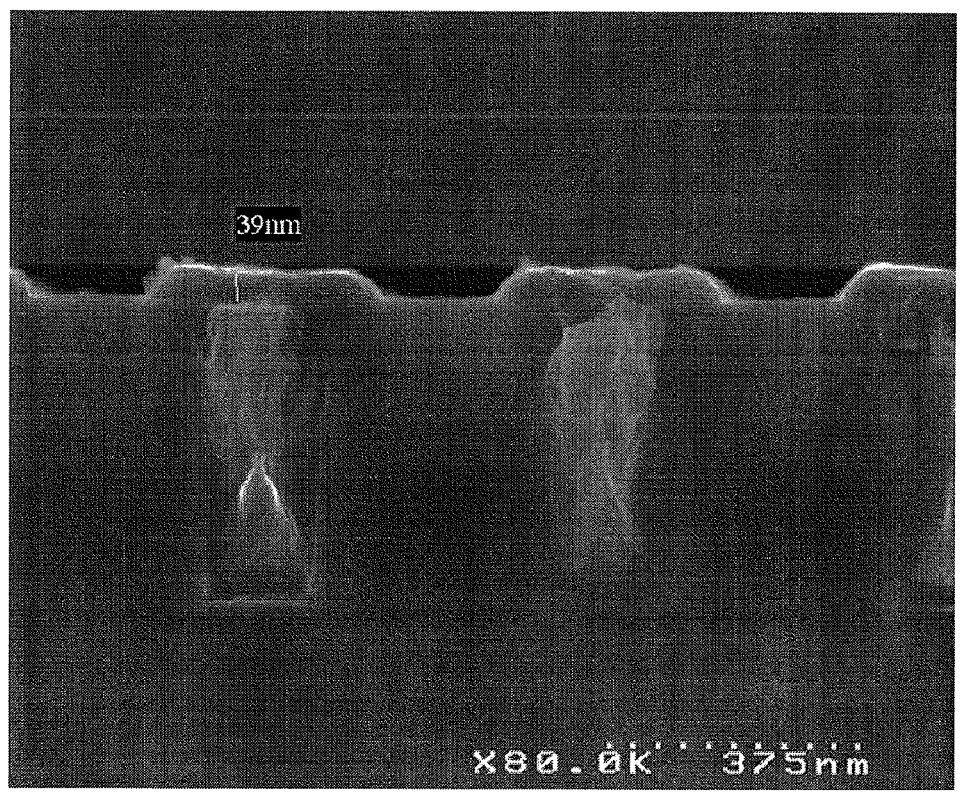
FIG. 7 shows an edge view at a magnification of 80 000 of the coupon of FIG. 3 after treatment with a solution allowing the deposition of a metal layer using an electroless process.

FIG. 7 (×80 000 magnification) shows an edge view of a surface as obtained in FIGS. 5 and 6 after treatment with a solution of metal ions for a metal plating using an electroless process.

Localized plating about 30 nm plumb with the copper lines is observed, allowing them to be selectively capped without producing short circuits between these platings.

Example 2

Activation of Copper Lines after CMP by the Grafting of 4-Ethyl-(Ammonium Tetrafluoroborate)-Diazonium Tetrafluoroborate ($DZ-NH_3^+$) as Compound of Formula (I)

This example is used to demonstrate the selective formation of catalytic palladium aggregates on 200 nm wide copper lines by the prior grafting of an organic layer using a diazonium salt ($DZ-NH_3^+$).

The specimens and cleaning solution ($S_{clean}$) and catalytic solution ($S_{cata}$) were identical to those described above in Example 1. The grafting solution ($S_{graft}$) was composed of 64.6 mg of $DZ-NH_3^+$ in 100 ml of acetonitrile.

The copper/$SiO_2$ composite surfaces were cleaned using the same protocol as described above in Example 1, then immersed for 15 minutes in the grafting solution, then rinsed with a 0.1 mol/l aqueous sodium hydroxide solution and then mordanted by the catalytic solution as in Example 1.

SEM examination revealed (not shown), as in Example 1 above, the highly selective formation of palladium aggregates plumb with the copper lines.

Example 3

Activation of Copper Lines after CMP by the Grafting of Ethylenediamine (EDA) as Compound of Formula (I)

This example is used to demonstrate the selective formation of catalytic palladium aggregates on 200 nm wide copper lines by the prior grafting of an organic layer using EDA.

The procedure was in every point identical to that of Example 2 above, but this time with a grafting solution consisting of 90 g of ethylenediamine in 100 ml of deionized water.

SEM examination revealed (not shown), as in Examples 1 and 2 above, the highly selective formation of palladium aggregates plumb with the copper lines.

Example 4

Grafting of Various Diazonium Salts onto Metals

This example is used to demonstrate the spontaneous grafting of various diazonium salts onto copper surfaces.

The diazonium salts used in this example were the following:

"Diazo $NH_3^+$: ($DZ-NH_3^+$)": 4-(2-aminoethyl)-benzene-diazonium, tetrafluoroborate disalt;
"Diazonitrile:(DZ-CN)": 4-cyanobenzene-diazonium, tetrafluoroborate salt;
"Diazosalicylic:(DZ-SAL)": 4-carboxy-3-hydroxybenzenediazonium, tetrafluoroborate salt;
"Diazoanhydride:(DZ-ANH)": 1,3-dioxo-1H,3H-benzo(de)isochromene-5-diazonium, tetrafluoroborate salt;
"DiazoNO$_2$/COOH: (DZ-NCOOH)": 3-carboxy-4-nitrobenzenediazonium, tetrafluoroborate salt; and
"DiazoCOOH(DZ-COOH)": 4-carboxybenzene-diazonium, tetrafluoroborate salt.

These salts were used to produce the grafting solutions $S_{graft}$ 01 to $S_{graft}$ 11 mentioned in Table IV below:

TABLE IV

| Reference | Composition of the solution |
| --- | --- |
| $S_{graft}$ 01 | $DZ-NH_3^+$ (64.6 mg) + 100 ml acetonitrile |
| $S_{graft}$ 02 | DZ-CN (43.4 mg) + 100 ml acetonitrile |
| $S_{graft}$ 03 | DZ-ANH (62.4 mg) + 100 ml acetonitrile |
| $S_{graft}$ 04 | DZ-NCOOH (56.2 mg) + 100 ml acetonitrile |
| $S_{graft}$ 05 | $DZ-NH_3^+$ (64.6 mg) + 100 ml acetonitrile + 1 g TMAp(*) |
| $S_{graft}$ 06 | DZ-CN (43.4 mg) + 100 ml acetonitrile + 1 g TMAp(*) |
| $S_{graft}$ 07 | DZ-ANH (62.4 mg) + 100 ml acetonitrile + 1 g TMAp(*) |
| $S_{graft}$ 08 | DZ-NCOOH (56.2 mg) + 100 ml acetonitrile + 1 g TMAp(*) |
| $S_{graft}$ 09 | DZ-CN (43.4 mg) + 100 ml $H_2SO_4$ 0.1 N |
| $S_{graft}$ 10 | DZ-ANH (62.4 mg) + 100 ml $H_2SO_4$ 0.1 N |
| $S_{graft}$ 11 | DZ-NCOOH (56.2 mg) + 100 ml $H_2SO_4$ 0.1 N |

(*)TMAp = tetramethylammonium perchlorate.

The specimens used were 5×1 cm$^2$ silicon coupons obtained by cleaving from a plane silicon wafer (i.e. not having etched features) covered with an approximately 500 nm $SiO_2$ layer, a 15 nm TiN layer, an approximately 50 nm copper nucleation layer formed by physical vapour deposition and then a thick (approximately 1.5 micron) copper plating obtained by electroplating. The wafer was then polished by CMP polishing over half the thickness of thick copper (called a "semi-polished" wafer) so as to deliver a plane, structureless copper surface having the same composition as the copper tracks after the CMP treatment.

The coupons thus prepared were immersed for 30 minutes in the $S_{graft}$ 01 to $S_{graft}$ 15 solutions presented above. After 30 minutes, the formation of grafted organic films was observed, these being perfectly resistant to the rinsing operations performed. The surfaces thus treated were analyzed by infrared reflection absorption spectroscopy (IRRAS) and clearly show the formation of an organic film exhibiting absorption bands characteristic of the functional groups carried by the precursor diazonium salts, as shown in Table V below:

TABLE V

| Nature of the immersion solution | Main peaks (cm$^{-1}$) |
| --- | --- |
| $S_{graft}$ 01 | 1608; 1511 |
| $S_{graft}$ 02 | 2229 |
| $S_{graft}$ 03 | 1742-1782; 1600 |
| $S_{graft}$ 04 | 1384; 1529-1492; 1617 |
| $S_{graft}$ 05 | 1608; 1511 |
| $S_{graft}$ 06 | 2229 |
| $S_{graft}$ 07 | 1742-1782; 1600 |
| $S_{graft}$ 08 | 1384; 1529-1492; 1617 |
| $S_{graft}$ 09 | 2230 |
| $S_{graft}$ 10 | 1598 |
| $S_{graft}$ 11 | 1734; 1589-1540; 1355 |

The tests were then continued with diazoanhydride ($S_{graft}$ 03) which is a good marker in IRRAS. Only the results relating to this diazo compound are given here, similar results having been obtained with the diazo compounds listed in Table IV above.

Figure 8:
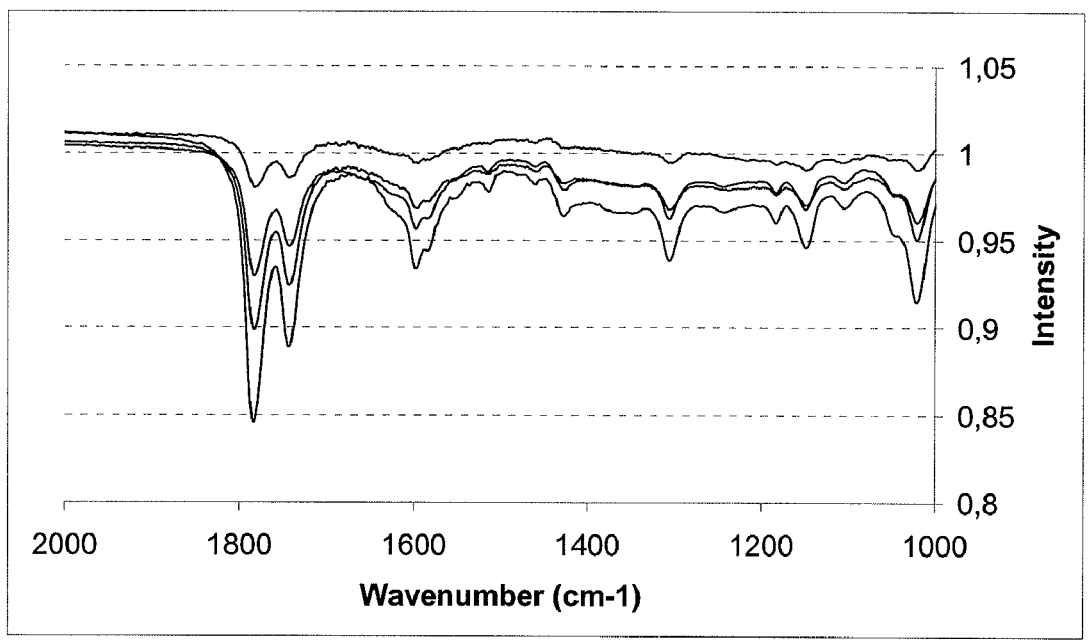
FIG. 8 shows the infrared reflection absorption spectra (IRRAS) of silicon coupons (peak intensity as a function of the wavenumber in cm$^{-1}$) and illustrates the variation in the grafting of a diazoanhydride film after 2, 10, 30 and 60 minutes of immersion in a diazoanhydride grafting solution. In this figure, the curve at the top corresponds to an immersion time of 2 minutes, and then the others that follow, downward and in this order, correspond to immersion times of 10, 30 and 60 minutes.

These results are plotted in FIG. 8, which shows the variation of the grafting as a function of the immersion time of the coupons in the grafting solution, showing the IRRAS spectrum for the grafted diazo layer after various immersion times of 2, 10, 30 and 60 minutes. In this figure, the curve at the top corresponds to an immersion time of 2 minutes and then those that follow downwards, and in this order, correspond to immersion times of 10, 30 and 60 minutes.

It may be seen that the characteristic absorption bands of the diazo film are more intense as the time in contact with the grafting solution increases, which may be attributed to a densification of the film, since it was observed elsewhere that, at the same time, its thickness changed little.

Figure 9:
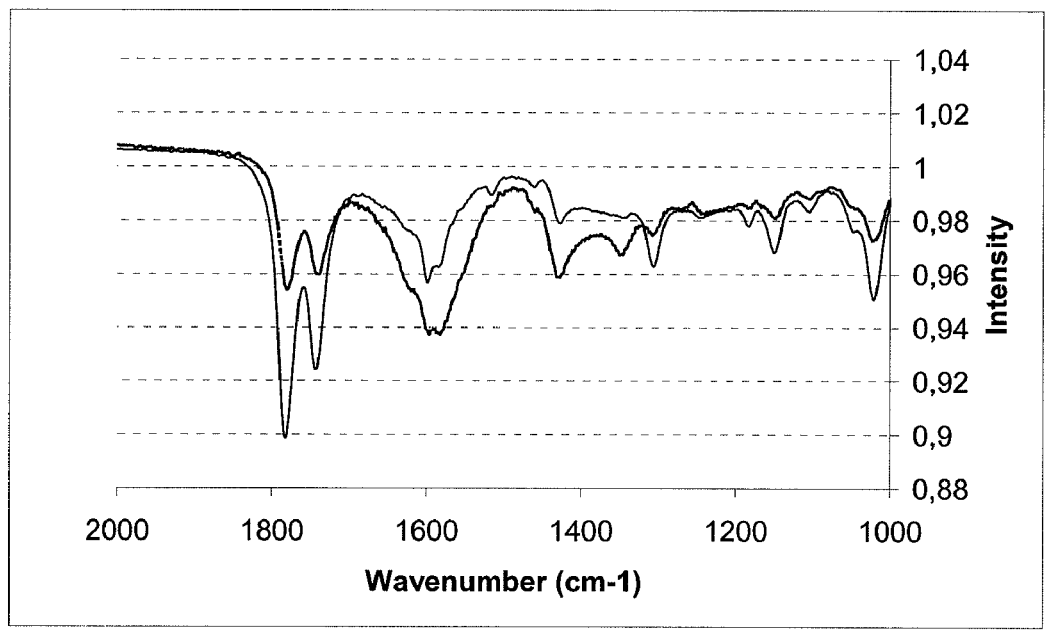
FIG. 9 shows the IRRAS spectra for two diazoanhydride layers obtained by immersing, for 30 minutes at room temperature, two semi-polished copper surfaces in a grafting solution containing 2×10$^{-3}$ mol/l of diazoanhydride in acetonitrile, before and after immersion in an ultrasonic bath in acetonitrile for 1 hour (bottom curve: before immersion; top curve: after immersion)

Finally, the appended FIG. 9 shows the IRRAS spectra for two diazoanhydride layers obtained by immersion for 30 minutes at room temperature of two semi-polished copper surfaces in a grafting solution containing 2×10$^{-3}$ mol/l of diazoanhydride in acetonitrile, one of which was then treated in an ultrasonic bath in acetonitrile for 1 hour (top curve).

The results obtained indicate that there is a reduction in the intensity of the characteristic diazo peaks, but they do not disappear. Even after one hour of ultrasonic treatment, the diazo film is still perfectly detectable, which illustrates the strength of the chemical grafting on the metal surface of the composite material according to the process of the invention.

Example 5

Production of Self-Aligned Barriers Using a Grafting Activation Step: Electrical Tests This example is used to illustrate the improvements in performance provided by the grafting according to the process of the invention in the activation of composite surfaces during the fabrication of self-aligned barriers.

To do this, self-aligned barriers in the form of electroless platings of metal alloys were formed using an electroless solution based on a cobalt salt, as described in U.S. Pat. No. 5,695,810.

This solution was used to deposit metal as a copper diffusion barrier, by electroless growth catalyzed by the presence of palladium aggregates. The solutions and the protocols, on the one hand, for cleaning (with citric acid) and, on the other hand, for palladium activation are those described above in Example 1.

The substrates used were 5×1 cm² coupons obtained by cleaving etched silicon wafers comprising, as in the previous examples, an $SiO_2$ layer (the dielectric), a TiN layer, a copper nucleation layer formed by physical vapour deposition, and a thick copper layer obtained by electroplating, and then treated by a CMP step until the dielectric lines were exposed. The starting surfaces were therefore composite surfaces consisting of alternations of copper and dielectric lines.

For this example, specific features were chosen. These are shown in top view in the appended FIG. 10, and are etched features of the "comb/coil" type, these being ideal for testing the electrical performance of the platings obtained.

Figure 10:
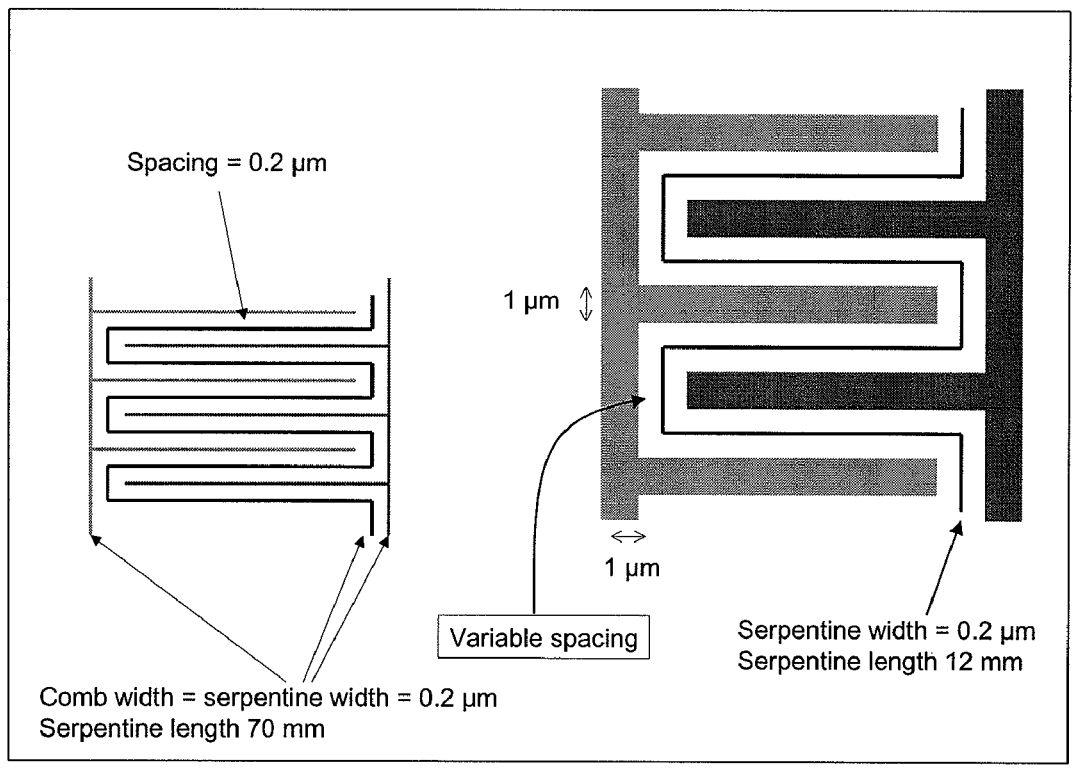
FIG. 10 shows the "comb/coil" features of an integrated circuit comprising an alternation of copper and dielectric lines.

Specifically, the tracks shown in FIG. 10 are copper tracks on which it was desired to produce a highly selective plating of a metal barrier. Once the treatment had been carried out, the "leakage current" measurement was performed, by measuring the electrical current flowing between the comb and the coil, when they were subjected to a potential difference. If the plating is ultraselective, there is no short circuit between the combs and the coil, and the measured leakage current is identical, or close, to that measured at the start between the bare copper tracks. At the slightest short circuit, a high "leakage current" is detected, which shows that the plating on the copper lines has not been selective. This test is even more drastic as a single short circuit point along the coil is sufficient to generate high leakage currents. It is therefore necessary for the plating process to be robust in order to obtain relevant results.

Here, the structures were such that the coils had a total length of 12 and 70 mm. Each coupon specimen carried several structures in which the spacing between the combs and the coil was different each time. This made it possible to test, on one and the same specimen, decreasing sizes of structure and to demonstrate the benefits of the capping technology for the finest structures.

Figure 11:
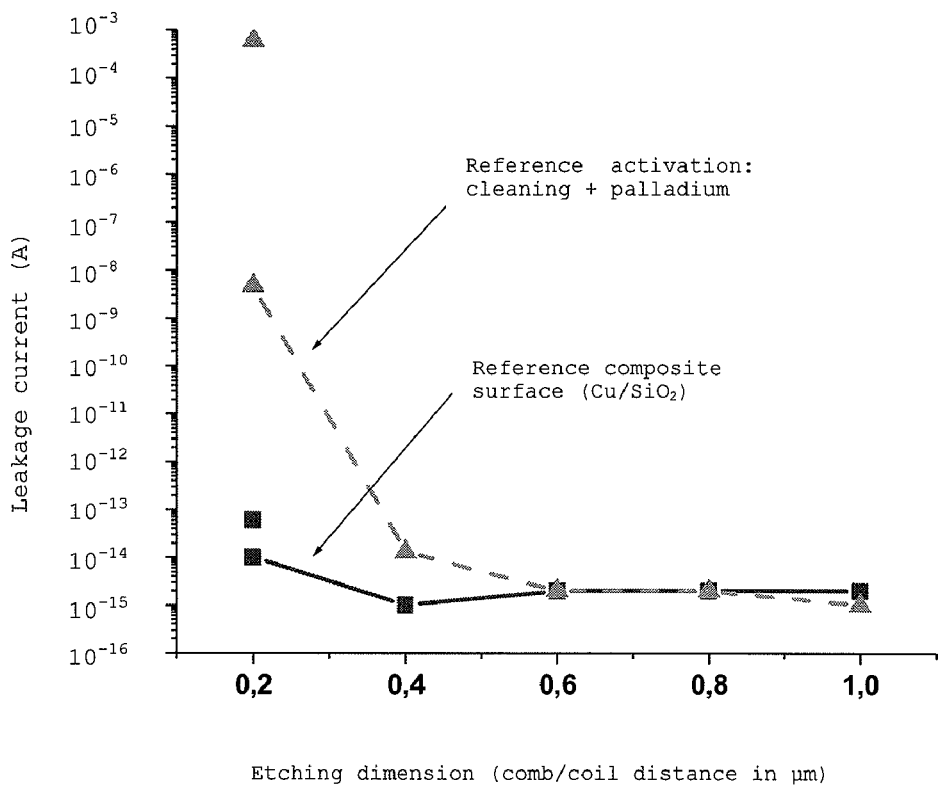
FIG. 11 shows the leakage current expressed in amps as a function of the etching dimension, that is to say the comb/coil distance expressed in μm, on a circuit according to that of FIG. 13 using a conventional process not involving a step of grafting an organic or organometallic film.
Figure 12:
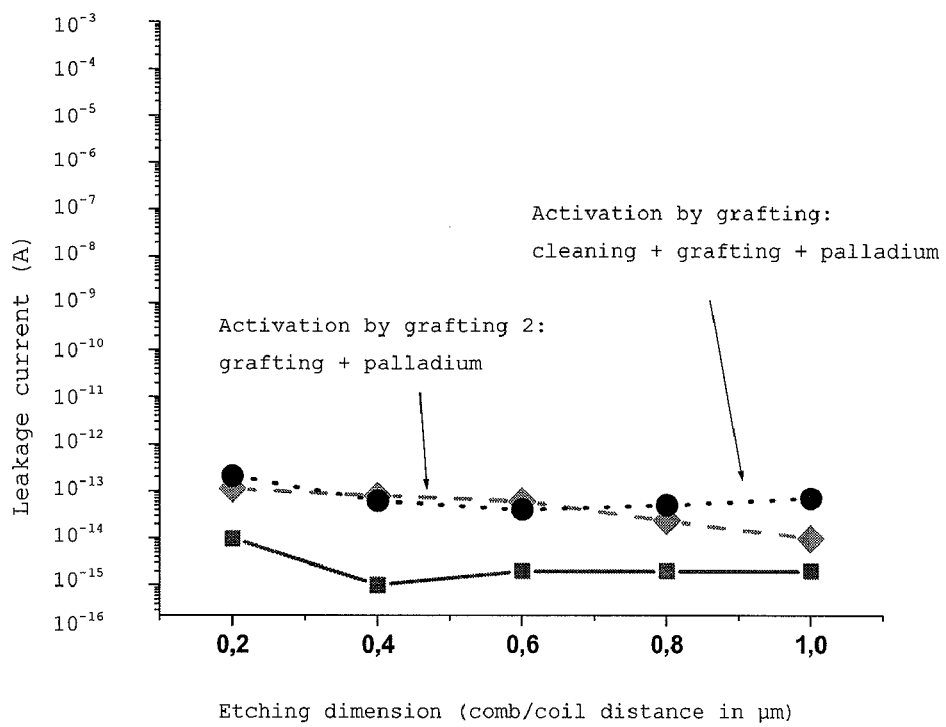
FIG. 12 shows the leakage current expressed in amps as a function of the etching dimension, that is to say the comb-coil distance expressed in μm on a circuit according to that of FIG. 13 using a process according to the present invention, that is to say one that includes a step of grafting a cysteamine film.

The corresponding results are plotted in FIGS. 11 and 12 appended hereto, in which the leakage current (in amps) is expressed as a function of the etching dimension, i.e. the distance between the combs and the coil, in μm.

FIG. 11 shows the leakage currents obtained for specimens treated using the conventional processes of the prior art, and therefore not forming part of the invention, namely a copper/$SiO_2$ composite starting substrate and the Cu/$SiO_2$ composite substrate after cleaning, palladium activation and electroless plating. It shows that the leakage currents obtained are higher on the finer structures (in particular the 0.2 μm structures).

This result is all the more irksome as the 0.2 μm structures are those encountered in 130 nm technology, while the structures encountered in 90, 65 or 45 nm technologies would be much more aggressive.

FIG. 12 shows the results obtained in the process of the invention when a grafting step is firstly inserted in order to enhance the palladium activation. The following sequence was then used overall for the activation: cleaning of the support; grafting of the cysteamine using the protocol described above in Example 1; palladium activation+electroless plating. It may be seen that the leakage currents obtained are substantially lower than those obtained above with the conventional process of the prior art, which does not include a step of grafting a difunctional precursor of formula (I). It is important to note that the same palladium activation protocol was used in both cases.

It is even more interesting to note that, if the capping of the copper lines is now carried out according to the following sequence: grafting of the cysteamine as in the protocol defined above in Example 1; palladium activation; and electroless plating, the measured leakage currents are just as good (i.e. just as low) as when the sequence is preceded by a cleaning step. This therefore illustrates the very high affinity of the grafting precursors for the metal areas of the composite surface, which are capable of "evening out" the properties of the surface before the step of mordanting with palladium.

Figure 13:
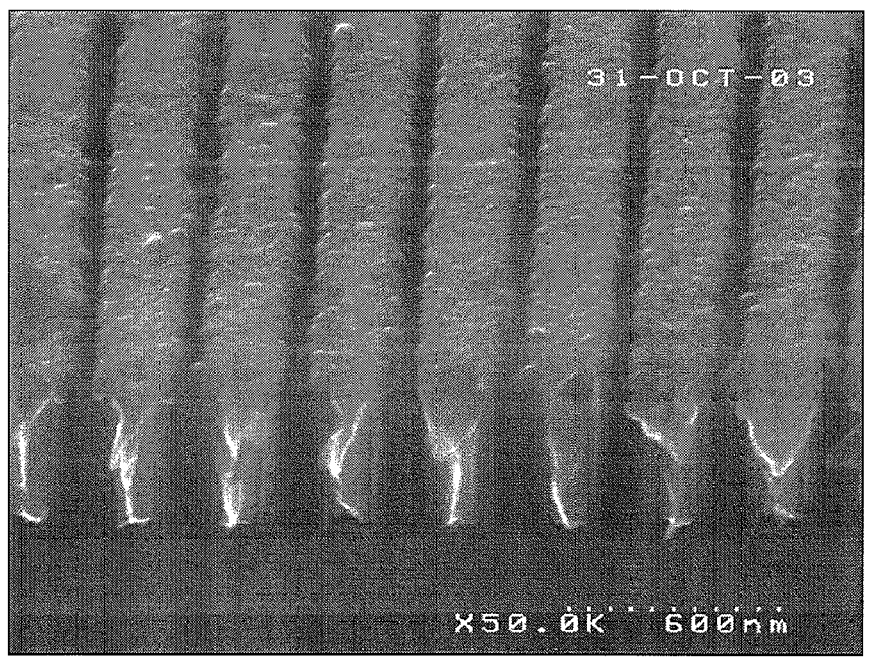
FIG. 13 is a perspective SEM view at a magnification of 50 000 of a silicon coupon having 0.16 μm etched copper features after treatment according to a conventional process of the prior art, one that does not include a step of grafting a compound of formula (I)
Figure 14:
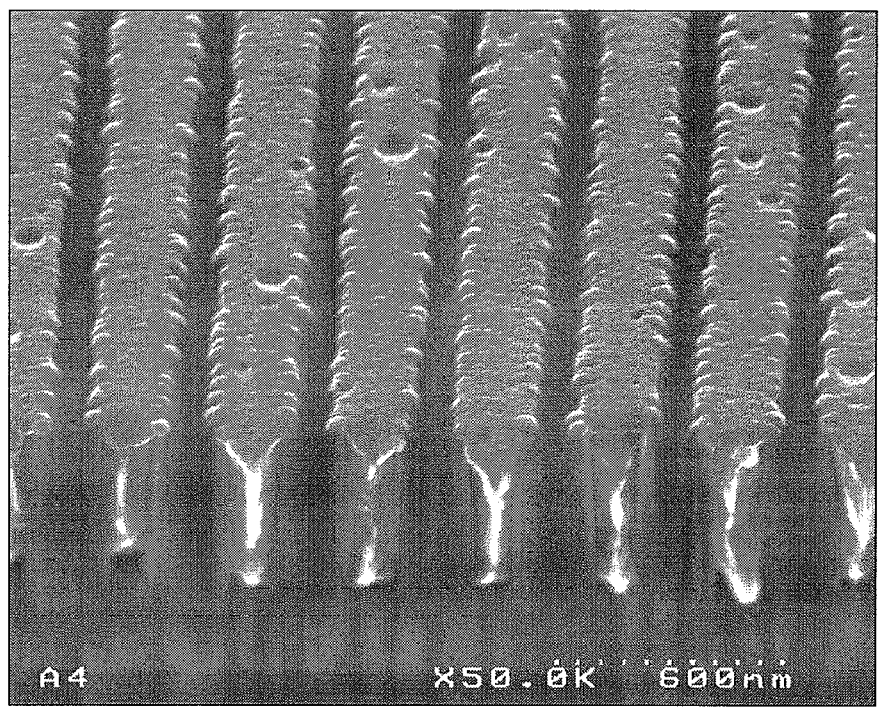
FIG. 14 is a perspective SEM view at a magnification of 50 000 of a silicon coupon that includes 0.16 μm etched copper features after treatment using the process according to the invention, that is to say one that includes a step of grafting a cysteamine film, the said process also including, after CMP, a cleaning step using a citric acid solution.
Figure 15:
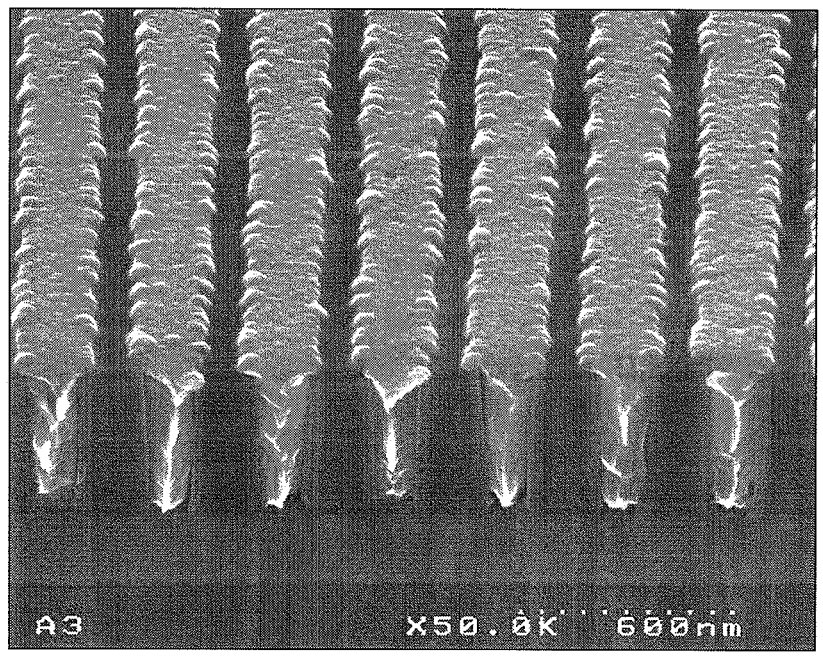
FIG. 15 is a perspective SEM view at a magnification of 50 000 of a silicon coupon comprising 0.16 μm etched copper features after a treatment using the process according to the invention, that is to say one that includes a step of grafting a cysteamine film, the said process also not including any cleaning step after CMP.

FIGS. 13, 14 and 15 are SEM photomicrographs at magnification of 50 000, which show the morphology of the platings obtained on 0.16 μm etched features, respectively with the conventional protocol not forming part of the invention (no grafting), according to the invention, i.e. including a step of grafting cysteamine as difunctional precursor of formula (I), and according to the protocol defined in Example 1 above, with or without cleaning prior to the grafting step. Firstly, it may be seen that the selectivity is, of course, superior with the process according to the invention, that is to say one that includes a grafting step (compare FIGS. 13 and 14), and that identical morphologies are obtained with or without cleaning prior to the grafting step (compare FIGS. 14 and 15).

Very advantageously, it may also be seen that the line resistances are not detectably modified by the grafting step (results not shown), which means, as a result of the grafting activation, a process which is promising from the industrial standpoint.

Example 6

Regioselective Grafting of Palladium Aggregates Via a Grafting Step

This example is used to illustrate the control that the grafting allows in controlling the densities and sizes of the aggregates obtained during a palladium activation step.

Carried out on Cu/$SiO_2$ composite surfaces identical to those used above in Example 1 was a sequence comprising: a cleaning step; a cysteamine grafting step; and a palladium mordanting step. The solutions and protocols used were the same as those described above in Example 1. Only the concentration of the cysteamine in the grafting solution was adjusted. Three grafting solutions were produced:

$S_{graft}$ F: with a cysteamine concentration equal to one half of the concentration of the grafting solution of Example 1, i.e. 56.8 g of aminoethanethiol-/98% HCl in 100 ml of ethanol;

$S_{graft}$ M: with a concentration identical to that of Example 1, i.e. 113.6 g of aminoethanethiol/98% HCl in 100 ml of ethanol;

$S_{graft}$ H: twice the concentration of that of Example 1, i.e. 227.2 g of aminoethanethiol/98% HCl in 100 ml of ethanol.

After the grafting, the mordanting was carried out with a palladium solution identical to that of Example 1. The same mordanting solution and the same mordanting protocol were used in all the plates of the present example.

Figure 16:
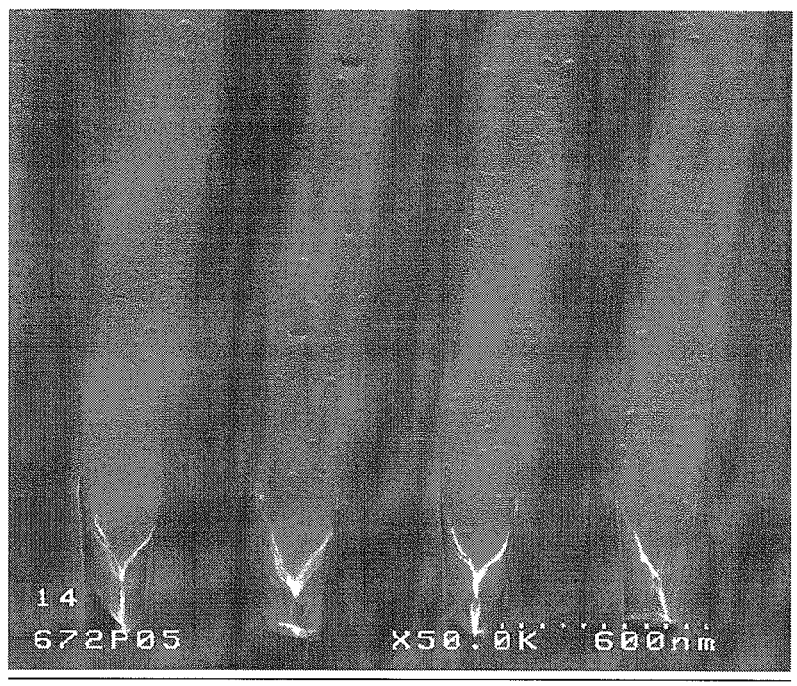
FIG. 16 is a perspective SEM view at a magnification of 50 000 of a silicon coupon comprising an alternation of copper and dielectric lines and treated using the process according to the invention, that is to say that includes a step of grafting a cysteamine film with a solution containing 56.8 g of aminoethanethiol and 98% HCl (cysteamine) in 100 ml of ethanol.

FIG. 16 shows an SEM photo at ×50 000 magnification of the results obtained with a grafting step using the grafting solution $S_{graft}$ F.

Figure 17:
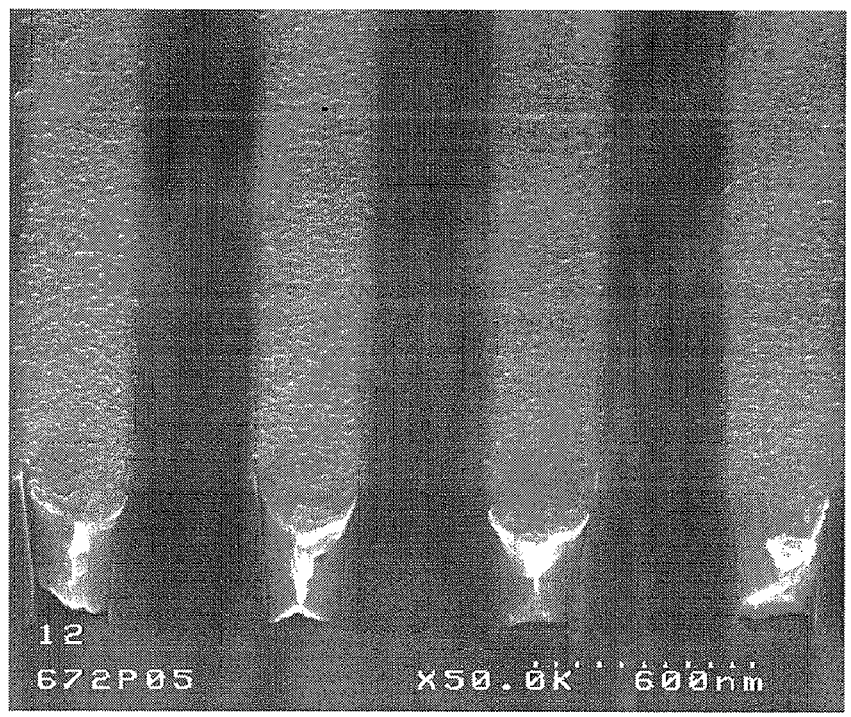
FIG. 17 is a perspective SEM view at a magnification of 50 000 of a silicon coupon comprising an alternation of copper and dielectric lines and treated using the process according to the invention, that is to say one that includes a step of grafting a cysteamine film with a solution containing 113.6 g of aminoethanethiol and 98% HCl (cysteamine) in 100 ml of ethanol.
Figure 18:
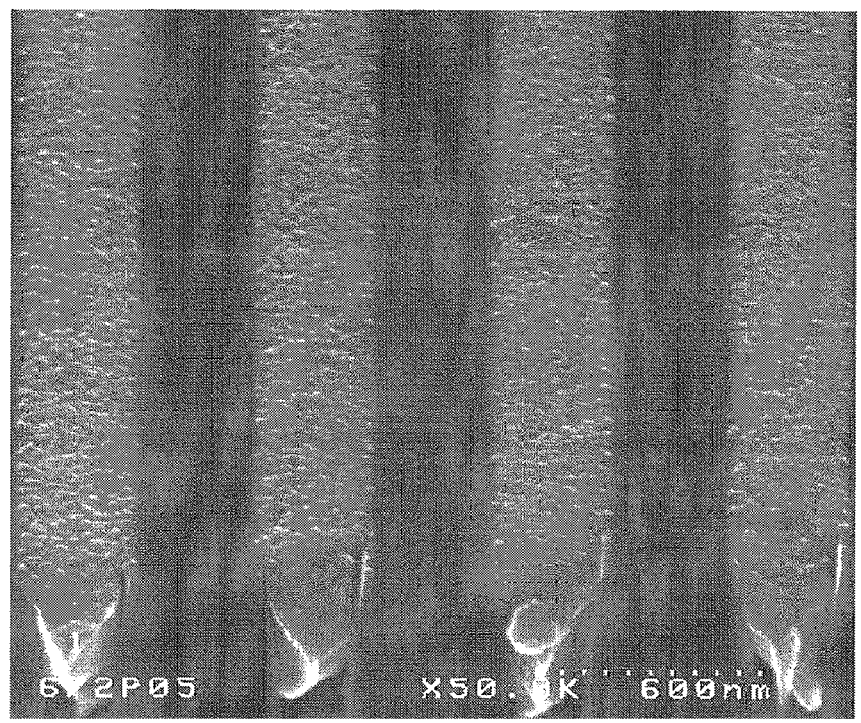
FIG. 18 is a perspective SEM view at a magnification of 50 000 of a silicon coupon comprising an alternation of copper and dielectric lines and treated using the process according to the invention, that is to say one that includes a step of grafting a cysteamine film with a solution containing 227.2 g of aminoethanethiol and 98% HCl (cysteamine) in 100 ml of ethanol.

FIG. 17 shows the results obtained with the grafting solution $S_{graft}$ M and FIG. 18 with the grafting solution $S_{graft}$ H.

It may be seen that, with same palladium mordanting solution and protocol, the concentration of grafting precursor in the organic bath allows the density and the size of the aggregates to be adjusted, the solution $S_{graft}$ H in fact delivering a greater amount of palladium plating than the solution $S_{graft}$ M, which itself gives a more dense plating than the solution $S_{graft}$ F.

This also reinforces the notion that grafting has a predominant role in the quality of the selectivity obtained, since it is identical whatever the density of aggregates produced.

The invention claimed is:

1. Process for coating a composite material on areas comprising electrically conductive or semiconductive metal areas, and electrically non-conductive areas, the said process comprising at least one step of electroless growth of a metal layer plumb with the said electrically conductive or semiconductive metal areas, characterized in that the electrically non-conductive areas of the composite material are not formed from organic polymers and in that, prior to the said electroless growth step, the said process furthermore includes at least one first step of forming a nucleation layer by covalent or dative grafting of an organic or organometallic film on, and only on, the said electrically conductive or semiconductive metal areas, by bringing the said layer into contact with a solution of organic or organometallic, difunctional precursors of the following formula (I):

$$A\text{-}(X)_n\text{-}B \qquad (I)$$

in which:
A is a group having at least one reactive chemical function allowing the said organic precursor to be covalently and selectively attached to the surface of the said electrically conductive areas;
X is a spacer arm covalently linked to A and to B;
n is an integer equal to 0 or 1; and
B is a group having at least one ligand function for metal ions or for metal aggregates, that is to say allowing the complexation of metal ions and/or metal aggregates.

2. Process according to claim 1, characterized in that the film has a thickness of between 1 and 100 nm.

3. Process according to claim 2, characterized in that the film has a thickness of between 1 and 10 nm.

4. Process according to claim 1, characterized in that it furthermore includes a mordanting second step during which the organic or organometallic film formed on the electrically conductive or semiconductive metal areas is brought into contact with a mordanting solution comprising either at least one precursor of a metallic material or at least one precursor of a catalyst for its deposition, the said second step being carried out at the same time as or after the first step of forming the organic or organometallic film.

5. Process according to claim 4, characterized in that the precursors of the metallic material that serve for the nucleation layer and are used in the mordanting solution during the second step are metal ions chosen from copper, zinc, gold, tin, titanium, vanadium, chromium, iron, cobalt, lithium, sodium, aluminium, magnesium, potassium, rubidium, caesium, strontium, yttrium, niobium, molybdenum, ruthenium, rhodium, palladium, silver, cadmium, indium, lutecium, hafnium, tantalum, tungsten, rhenium, osmium, iridium, platinum, mercury, thallium, lead and bismuth ions, ions of the lanthanides and of the actinides, and mixtures thereof.

6. Process according to claim 5, characterized in that the concentration of metal ions in the mordanting solution is less than $10^{-4}$M.

7. Process according to claim 1, characterized in that it furthermore includes, before the step of electroless growth of the metal layer is carried out, a third step that consists in reducing the said organometallic compound of formula (I) and/or the said precursor of the metallic material or the precursor of a catalyst for its deposition as a metallic material, or as a catalyst for its deposition, respectively.

8. Process according to claim 1, characterized in that the reactive function of the groups A of the difunctional, organic or organometallic, precursors of formula (I) is chosen from functions carrying lone pairs, radicals obtained from cleavable functions, carbocations and carbanions.

9. Process according to claim 8, characterized in that the cleavable functions are chosen from disulphide, diazonium, sulphonium, iodonium and ammonium functions and alkyl or aryl iodides.

10. Process according to claim 8, characterized in that the said reactive function of the groups A is a function carrying lone pairs chosen from amine, pyridine, thiol, ester, carboxylic acid, hydroxamic acid, thiourea, nitrile, salicylic, amino acid and triazine functions.

11. Process according to claim 1, characterized in that X is chosen from: linear or branched alkane chains; the phenylene group ($—C_6H_4—$); phenylene groups substituted with electron-withdrawing or electron-donating groups; groups carrying several fused aromatic rings, which are themselves optionally substituted with one or more electron-donating or electron-withdrawing groups; and structures consisting of combinations of these groups.

12. Process according to claim 1, characterized in that the ligand functions defined as regards part B of the difunctional precursors of formula (I) are chosen from amines, amides, pyridines, nitriles, amino acids, triazines, bipyridines, terpyridines, quinolines, orthophenanthroline compounds, ethers, carbonyls, carboxyls and carboxylates, esters, hydroxamic acids, salicylic acids, phosphines, phosphine oxides, thiols, thioethers, disulphides, ureas, thioureas, crown ethers, azacrown compounds, thio-crown compounds, cryptands, sepulcrates, podands, porphyrins, calixarenes, naphthols, isonaphthols, siderophores, antibiotics, ethylene glycol and cyclodextrins; substituted and/or functionalized molecular structures based on these functional groups; and their metal complexes with one or more metal ions or metal aggregates.

13. Process according to claim 1, characterized in that the compounds of formula (I) are chosen from: aryldiazonium salts functionalized in the para position of the diazonium group by a ligand function, optionally via a spacer arm X; alkyl or aryl iodides functionalized by a ligand function; bipyridines; aminothiols; diamines and polyethyleneimine.

14. Process according to claim 13, characterized in that the aryldiazonium salts functionalized in the para position of the diazonium group by a ligand function are chosen from 4-ethylammoniumphenyldiazonium tetrafluoroborate, 4-(2-aminoethyl)benzenediazonium ditetrafluoroborate, 4-cyanobenzenediazonium tetrafluoroborate, 4-caroxy-3-hydroxybenzenediazonium tetrafluoroborate, 3-carboxy-4-nitrobenzenediazonium tetrafluoro-borate, 4-carboxybenzenediazonium tetrafluoroborate and 4-thioethanolphenyldiazonium tetrafluoroborate.

15. Process according to claim 13, characterized in that the aminothiols are chosen from cysteamine, aminopropanethiol, aminohexanethiol and sulphur-containing amino acids.

16. Process according to claim 11, characterized in that the diamines are chosen from ethylenediamine and hexamethylenediamine.

17. Process according to claim 1, characterized in that the said composite material is brought into contact with the solution of difunctional precursors by immersion, by spin coating or by spraying.

18. Process according to claim 1, characterized in that the surface of the composite material consists of an alternation of copper tracks with a width of L, separated from the dielectric tracks.

19. Process according to claim 18, characterized in that the width L is between 150 and 30 nm.

20. Process for fabricating interconnects in microelectronics, electronic microsystems or integrated circuits, characterized in that it includes at least one step of grafting a film of difunctional precursors of formula (I) using the coating process as defined in claim 1, the said interconnects being made of a metallic material.

21. Process according to claim 20, characterized in that it comprises, in the following order, the steps consisting in:
 a) etching interconnect features in a dielectric substrate, the said features forming trenches and/or vias, and optionally projections, on and/or through the said substrate,
 b) depositing a conductive barrier layer on the said etched dielectric substrate, which barrier layer prevents the migration of the interconnect metallic material into the said substrate, the said barrier layer having a thickness such that the free face of this layer conformally follows the interconnect features of the said substrate on which it is deposited;
 c) coating the conductive barrier layer deposited on the etched substrate with a nucleation film of a metallic material;
 d) filling the trenches and/or vias with the said metallic material starting from the said nucleation film, in order to form the said metal interconnects made of the said metallic material;
 e) uniformly and homogeneously abrading the surface, for a time sufficient to cut off the protruding parts of the said etched features, in order to obtain a copper/dielectric composite surface;
 f) activating the said composite surface using the process and as defined in claim 1 via the deposition of an organic or inorganic film grafted onto and self-positioned with respect to the conductive copper features of the composite surface; and
 g) using the said film as a catalytic layer or nucleation layer for the electroless growth of a metal layer as a copper diffusion barrier, the said metal layer being self-positioned with respect to the conductive copper features of the composite surface.

22. Interconnect elements in microelectronics, electronic microsystems and integrated circuits that can be obtained by implementing the process of claim 21.

23. A method for the fabrication of interconnect elements in microelectronics, of electronic microsystems or of integrated circuits which includes the process of claim 20.

24. A method for the fabrication of interconnect elements in microelectronics, of electronic microsystems or of integrated circuits which includes the process of claim 23.

25. Interconnect elements in microelectronics, electronic microsystems and integrated circuits that can be obtained by implementing the process of claim 20.

* * * * *

UNITED STATES PATENT AND TRADEMARK OFFICE
CERTIFICATE OF CORRECTION

PATENT NO. : 8,298,946 B2  
APPLICATION NO. : 10/599214  
DATED : October 30, 2012  
INVENTOR(S) : Bureau et al.

Page 1 of 1

It is certified that error appears in the above-identified patent and that said Letters Patent is hereby corrected as shown below:

In the Specifications

Column 8,
Line 21, "nitrites" should read --nitriles--.

In the Claims

Column 29,
Line 1, "claim 11" should read --claim 13--.

Signed and Sealed this
Fourteenth Day of May, 2013

Teresa Stanek Rea
*Acting Director of the United States Patent and Trademark Office*